(12) United States Patent
Kesterson et al.

(10) Patent No.: US 8,184,762 B2
(45) Date of Patent: May 22, 2012

(54) DIGITAL PHASE LOCK LOOP WITH MULTI-PHASE MASTER CLOCK

(75) Inventors: John W. Kesterson, San Jose, CA (US); Carrie Seim, Campbell, CA (US); Selcuk Sen, Mountain View, CA (US); Xuecheng Jin, Palo Alto, CA (US)

(73) Assignee: iWatt, Inc., Campbell, CA (US)

( * ) Notice: Subject to any disclaimer, the term of this patent is extended or adjusted under 35 U.S.C. 154(b) by 867 days.

(21) Appl. No.: 12/266,383

(22) Filed: Nov. 6, 2008

(65) Prior Publication Data
US 2010/0111241 A1 May 6, 2010

(51) Int. Cl.
*H03D 3/24* (2006.01)
*H03L 7/00* (2006.01)
*H03L 7/06* (2006.01)

(52) U.S. Cl. ............ 375/376; 327/156; 331/25

(58) Field of Classification Search .......... 375/371, 375/373, 375, 376; 327/147, 149, 150, 156, 327/158, 159; 331/1 R, 18, 25, 1 A
See application file for complete search history.

(56) References Cited

U.S. PATENT DOCUMENTS

| 7,205,798 B1 * | 4/2007 | Agarwal et al. ............ 327/105 |
| 2006/0140322 A1 * | 6/2006 | Johnson et al. ............ 375/376 |
| 2006/0250170 A1 * | 11/2006 | Wang ........................... 327/156 |

* cited by examiner

*Primary Examiner* — Betsy Deppe
(74) *Attorney, Agent, or Firm* — Fenwick & West LLP

(57) ABSTRACT

A digital phase lock loop circuit provides an output with reduced jitter. The digital phase lock loop circuit includes a phase frequency detector that determines a phase difference between a feedback signal and a reference frequency signal to generate an error signal indicative of the phase difference. A numerically controlled oscillator generates a first oscillator output signal with a frequency proportional to the error signal and a second oscillator output signal indicative of jitter of the first oscillator output signal in reference to the reference frequency signal. A phase accuracy extender determines a delay amount from the second oscillator output signal and delays the first oscillator output signal by the delay amount to generate a phase-enhanced output signal with edges aligned with one of a plurality of reference clock signals.

20 Claims, 15 Drawing Sheets

DIGITAL PHASE LOCK LOOP WITH MULTI-PHASE MASTER CLOCK

BACKGROUND

1. Field of Art

The present invention relates to phase lock loops and, more specifically, to reducing jitter in the output of phase lock loops.

2. Description of the Related Art

Performance requirements for phase lock loops are increasing. For example, video standards are increasing in speed and complexity, resulting in increased performance requirements for phase lock loops used to synchronize the sampling of video signals by clocked analog-to-digital converters as part of video pixel clock reconstruction. In high-definition video systems, differential and integral jitter requirements are particularly stringent due to the higher pixel density of high-definition video standards.

A differential jitter requirement specifies that the adjacent time between edges of a reference signal and edges of an output signal of the phase lock loop shall not depart from those of an ideal clock at the correct center frequency by more than some amount. An integral jitter requirement specifies that, over the period of the reference signal, the placement of the edges of the output signal produced by the phase lock loop shall not depart from those of an ideal clock at the perfect center frequency and perfectly phase locked to the reference signal by some amount. Conventional phase lock loops are unable to produce outputs that meet these increased jitter performance requirements without sacrificing other performance criteria.

SUMMARY

Embodiments of a digital phase lock loop circuit are disclosed. In one embodiment, the digital phase lock loop circuit includes a phase frequency detector configured to receive a reference frequency signal, a feedback signal derived from an output signal of the digital phase lock loop circuit, and a plurality of reference clock signals. The phase frequency detector determines a phase difference between the feedback signal and the reference frequency signal to generate an error signal indicative of the phase difference. The digital phase lock loop circuit also includes a numerically controlled oscillator configured to receive the error signal. The numerically controlled oscillator generates a first oscillator output signal with a frequency proportional to the error signal and a second oscillator output signal indicative of jitter of the first oscillator output signal in reference to the reference frequency signal. The digital phase lock loop circuit further includes a phase accuracy extender configured to receive the first oscillator output signal, the second oscillator output signal, and the plurality of reference clock signals. The phase accuracy extender determines a delay amount from the second oscillator output signal and delays the first oscillator output signal by the delay amount to generate a phase-enhanced output signal with edges aligned with one of the plurality of reference clock signals.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the disclosed subject matter.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

According to various embodiments of the present invention, a multi-phase clock is used to reduce jitter and decrease phase error within a digital phase lock loop. A multi-phase counter which decreases phase error is described. A phase accuracy extender circuit which reduces jitter is described.

Figure 1:
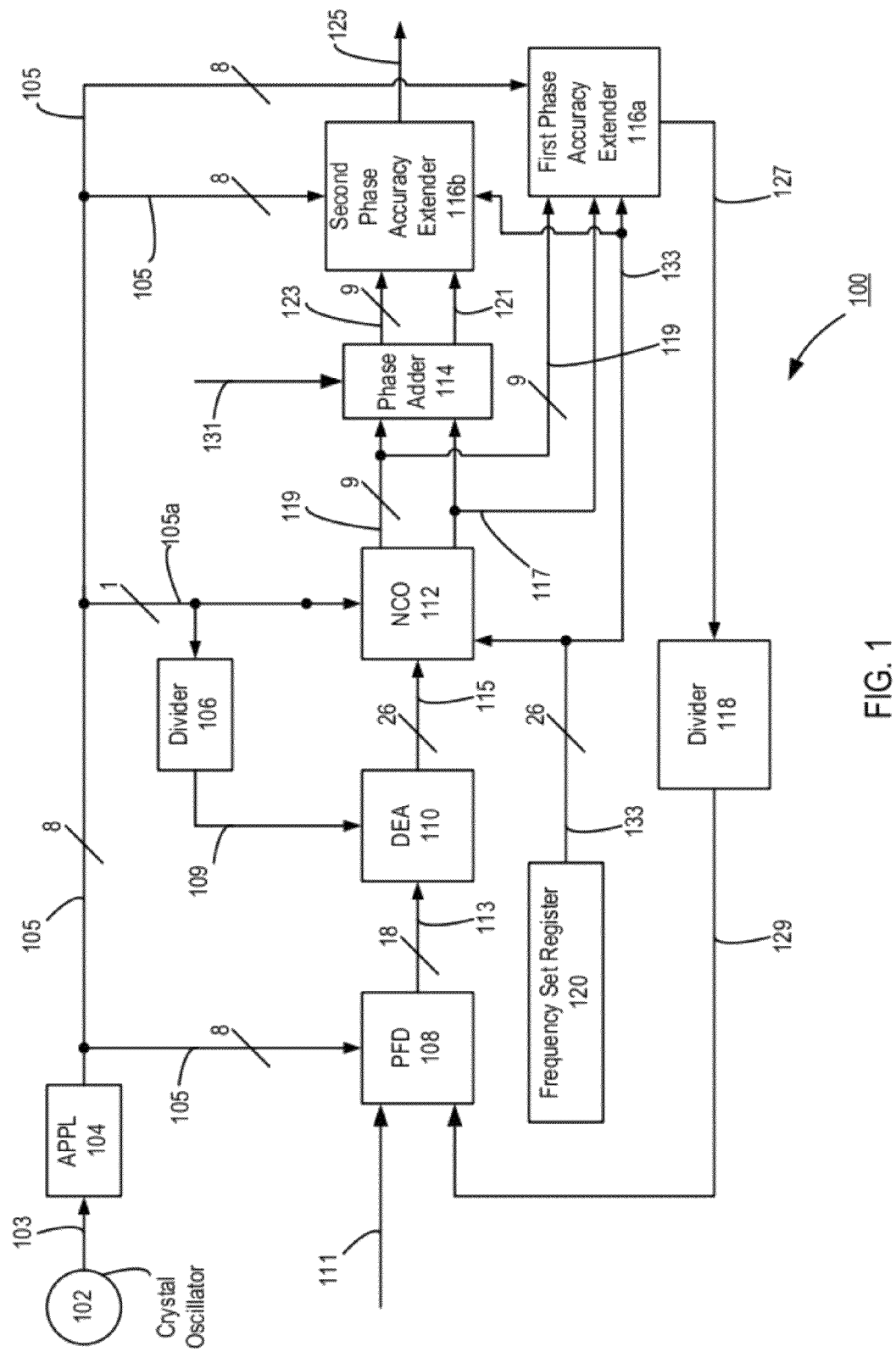
FIG. 1 illustrates a digital phase lock loop (DPLL) in accordance with one embodiment of the present invention.

FIG. 1 illustrates a digital phase lock loop (DPLL) 100 in accordance with one embodiment of the present invention. Crystal oscillator 102 outputs a signal 103 at a reference frequency to a conventional analog phase lock loop (APPL) 104. APPL 104 produces a multi-phase clock 105 at a frequency that is some integer multiple of the reference frequency 103. In the exemplary embodiment depicted in FIG. 1, the reference frequency of signal 103 is 24 MHz and APPL 104 generates an 8-phase clock 105 with a frequency of 336 MHz (the 24 MHz reference frequency 103 multiplied by 14). Hence, the 8-phase clock 105 comprises eight signals, each with a frequency of 336 MHz and a period of 2.96 nanoseconds. The second phase of the 8-phase clock 105 lags the first phase by 372 picoseconds (⅛ of 2.96 nanoseconds), the third phase lags the second phase by 372 picoseconds, the fourth phase lags the third phase by 372 picoseconds, and so on. Other embodiments are possible in which APPL 104 generates multi-phase clocks at other frequencies and comprising a different number of phases.

The 8-phase clock 105 generated by the APPL 104 is input to phase frequency detector (PFD) 108, first phase accuracy extender 116a, and second phase accuracy extender 116b. The first phase of the 8-phase clock 105, referred to hereinafter as the reference phase 105a, is also input to divider 106 and to numerically controlled oscillator (NCO) 112.

In addition to the 8-phase clock 105, PFD 108 also accepts as inputs a reference frequency 111 to which DPLL 100 should lock and a divided DPLL feedback signal 129. From these inputs, PFD 108 outputs an error signal 113 to digital error amplifier (DEA) 110. In one embodiment, the error signal 113 is 18 bits wide. The error signal 113 output by PFD 108 describes a difference in phase between the reference frequency 111 and the divided DPLL feedback signal 129. DEA 110 is a Z-domain digital implementation of a conventional loop filter. DEA 110 accepts as inputs the error signal 113 and a slow clock signal 109 derived from the reference phase 105a by conventional divider 106. The slow clock signal 109 is used by DEA 110 to implement a Z-domain time delay. DEA 110 outputs a control signal 115 to the NCO 112. In one embodiment, the control signal 115 is 26 bits wide.

In addition to the control signal 115, the reference phase 105a and a frequency set value 133 are input to NCO 112. In one embodiment, the frequency set value 133 is a 26-bit binary number delivered by frequency set register 120. NCO 112 outputs two signals. The first output of NCO 112 is the most significant bit (MSB) of a phase accumulator register (PAR) 306 (see FIG. 3) included in the NCO 112, referred to hereinafter as the primary oscillator output 117. A period of the primary oscillator output 117 represents a rollover of the PAR 306. In one embodiment, the primary oscillator output 117 has a frequency equal to the reference frequency 111 multiplied by the divider value of divider 118, which is included in a feedback path of DPPL 100.

In the exemplary embodiment depicted in FIG. 1, the second output of the NCO 112, referred to hereinafter as the secondary oscillator output 119, comprises the most significant 9 bits of PAR 306 (see FIG. 3). The secondary oscillator output 119 provides information regarding overshoot within PAR 306 upon a rollover. In other embodiments, the secondary oscillator output 119 can comprise a different selection of bits from PAR 306. Additional structural and operational details for NCO 112 are discussed below in reference to FIGS. 3A and 3B.

The primary oscillator output 117 and secondary oscillator output 119 are each fed into first phase accuracy extender 116a. First phase accuracy extender 116a operates on these signals using the 8-phase clock 105 to produce a phase-enhanced feedback signal 127. In one embodiment, the phase-enhanced feedback signal 127 has a frequency equal to that of the primary oscillator output 117. As NCO 112 is clocked by the reference phase 105a, the edges of both the primary oscillator output 117 and the secondary oscillator output 119 are aligned with an edge of the reference phase 105a. However, the phase-enhanced feedback signal 127 can be generated to have edges that are aligned with the edges of any one of the 8-phase clock 105 signals, not necessarily the reference phase 105a. Further details of the operation of first phase accuracy extender 116a are provided below in reference to FIGS. 4A-4D. The phase-enhanced feedback signal 127 is routed from first phase accuracy extender 116a to divider 118. In one embodiment, divider 118 is a conventional asynchronous divider and generates the divided DPLL feedback signal 129 based on the phase-enhanced feedback signal 127.

Routing the divided DPLL feedback signal 129 to PFD 108 closes a negative feedback loop within DPLL 100 comprising PFD 108, DEA 110, NCO 112, first phase accuracy extender 116a, and divider 118. The negative feedback loop allows DPPL 100 to match the frequency of the divided DPLL feedback signal 129 to the reference frequency 111. When these frequencies are matched, a constant offset exists between their phases. In one embodiment of DPLL 100, the constant offset approaches zero. Under such operating conditions, DPLL 100 is said to have achieved "phase lock" and is described herein as "locked."

In addition to first phase accuracy extender 116a, the primary oscillator output 117 and secondary oscillator output 119 are also fed into phase adder 114. Phase adder 114 also receives an offset select input 131 from one or more control registers (not shown) that specifies a phase offset. Phase adder 114 is a conventional 9-bit phase adder and outputs a primary offset signal 121 that results from adding the specified phase offset to the primary oscillator output 117. Phase adder 114 also outputs a secondary offset signal 123 that results from adding the specified phase offset to the secondary oscillator output 117. Hence, in the exemplary embodiment depicted in FIG. 1, the secondary offset signal 123 comprises 9 signals.

The primary offset signal 121 and the secondary offset signal 123 produced by the phase adder 114 are input to second phase accuracy extender 116b. Second phase accuracy extender 116b operates upon the primary offset signal 121 and the secondary offset signal in a manner similar to how first phase accuracy extender 116a operates upon the primary oscillator output 117 and the secondary oscillator output to produce a phase-enhanced DPLL output 125. In one embodiment, the phase-enhanced DPLL output 125 has a frequency equal to that of the primary offset signal 121. Second phase extender 116b analyzes the secondary offset signal 123 to determine a delay and applies the delay to the primary offset signal 117 to align the edges of the phase-enhanced DPLL output 125 with the edges of one of the 8-phase clock 105 signals.

Figure 2A:
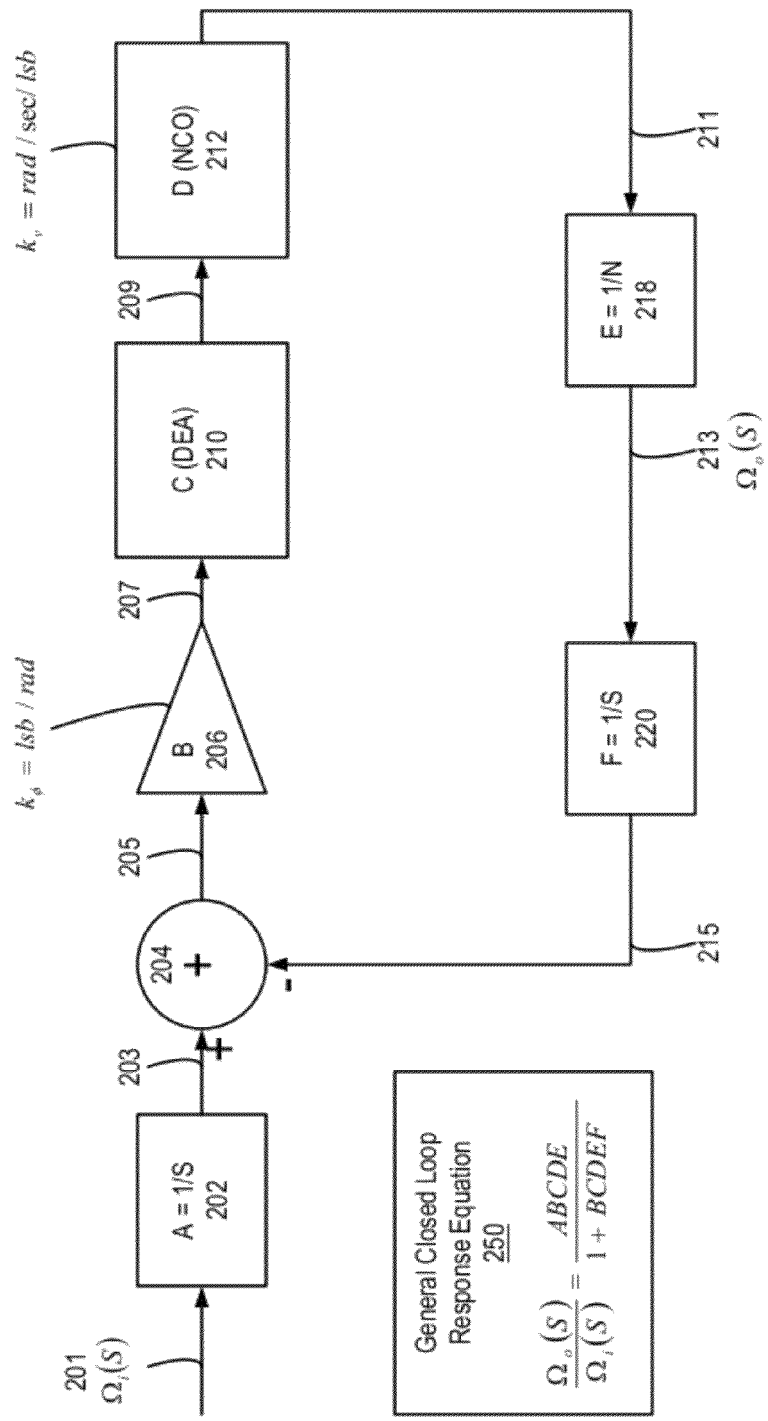
FIG. 2A illustrates a Laplace model of a DPLL in accordance with one embodiment of the present invention.

FIG. 2A illustrates a Laplace model 200 of a DPLL in accordance with one embodiment of the present invention. In one embodiment, Laplace model 200 models DPLL 100. Laplace model 200 operates upon an input frequency 201 to produce an output frequency 213. In one embodiment, the input frequency 201 is the Laplace equivalent of the reference frequency 111 of FIG. 1. The input frequency 201 is transformed into an input phase 203 by block A 202, which implements a 1/S transform. Hence, the input phase 203 represents the phase of the input frequency 201 as a function of time. The input phase 203 is input to adder 204, which in one embodiment corresponds to PFD 108 of FIG. 1. Adder 204 monitors the phase difference between the phase input 203 and a phase output 215. Adder 204 outputs a corresponding phase error 205 signal. The phase error 205 is scaled by block B 206, whose gain corresponds to the phase detector sensitivity of one embodiment of PFD 108. As indicated in FIG. 2A, phase detector sensitivity (sometimes referred to as phase detector gain) is commonly denoted as $k_\phi$ and, in digital systems, can be expressed as a multiplier with units of least-significant-bits per radian (lsb/rad).

Block B 206 operates on the phase error 205 to output a multiplied phase error 207 signal to block C 210, which in one embodiment is the Laplace equivalent of DEA 110. In turn, block C 210 outputs a control signal 209 to block D 212. Block D 212 outputs a varying frequency signal 211. The frequency of the varying frequency signal 211 depends on the control signal 209 and the gain of block D 212, which corresponds to the oscillator gain of one embodiment of NCO 112. As indicated in FIG. 2A, oscillator gain is commonly denoted as $k_v$ and, in digital systems, can be expressed as a multiplier with units of radians per second (frequency) per least-significant-bit (rad/sec/lsb).

The varying frequency signal 211 output by block D 212 is input to block E 218, which represents a 1/N divider and in one embodiment is the Laplace equivalent of divider 118. For the purposes of Laplace model 200, the output of block E 218 may be considered the output frequency 213 (in a phase lock loop, the oscillator output is typically considered the output frequency, but such terminology choices are arbitrary and have no effect on the model). The output frequency 213 is input to block F 220 which implements a 1/S transform to generate the phase output 215 monitored by adder 204, thereby completing a closed negative feedback loop. Accordingly, the behavior of the DPLL 100 can be modeled from the parameters of Laplace model 200 by inserting the parameters into the corresponding general closed loop response equation 250. The general closed loop response equation 250 may be derived via standard Laplace-based transfer function analysis of Laplace model 200.

Figure 2B:
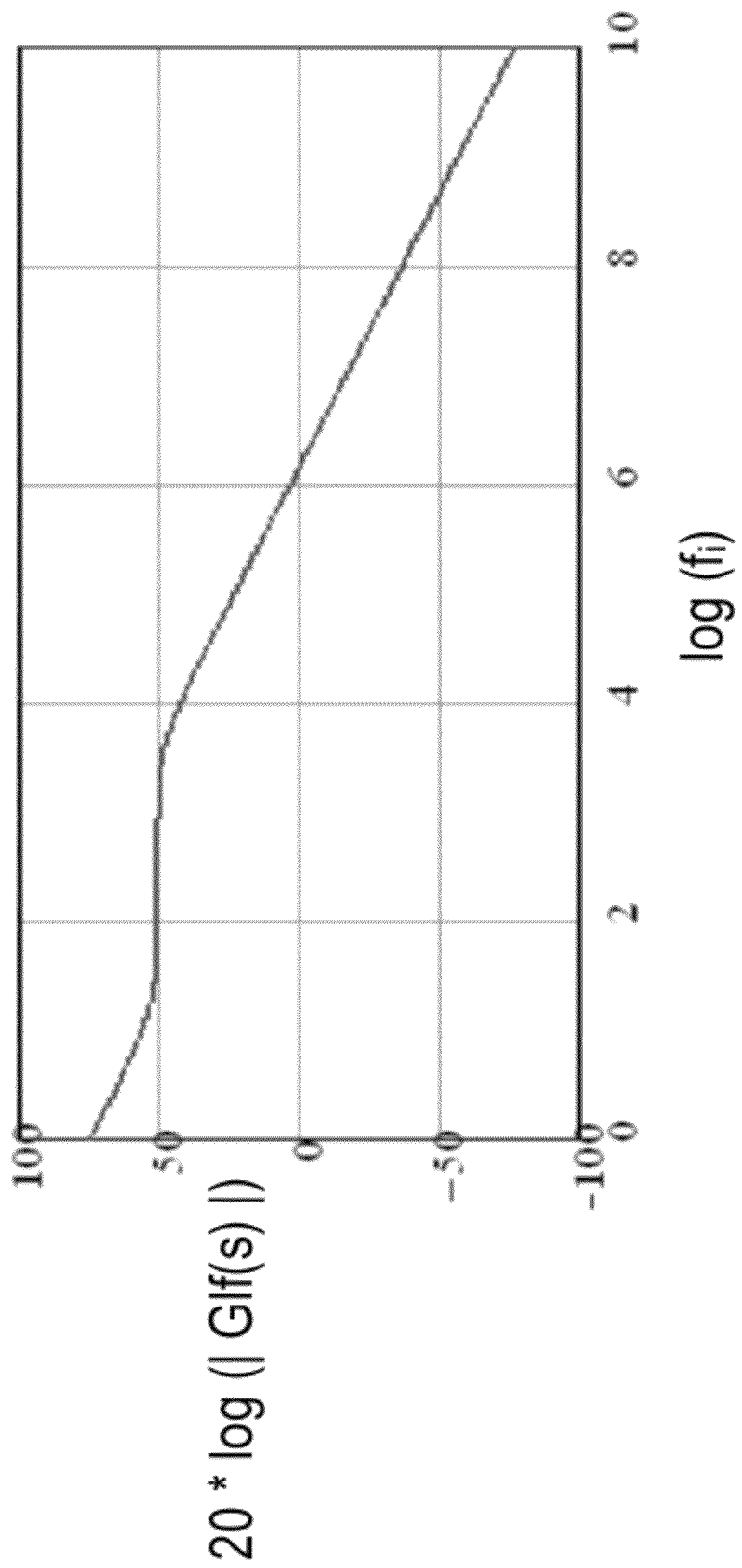
FIG. 2B illustrates a frequency response of a digital error amplifier in accordance with one embodiment of the present invention.

FIG. 2B depicts the Laplace domain transfer function of block C 210 in one embodiment. In an embodiment in which block C 210 is the Laplace equivalent of DEA 110, the graph of FIG. 2B represents the gain of any signal operated upon by DEA 110 as a function of frequency. Specifically, the graph of FIG. 2B is a Laplace domain approximation of the Z-domain transfer function implemented by one embodiment of DEA 110.

Figure 2C:
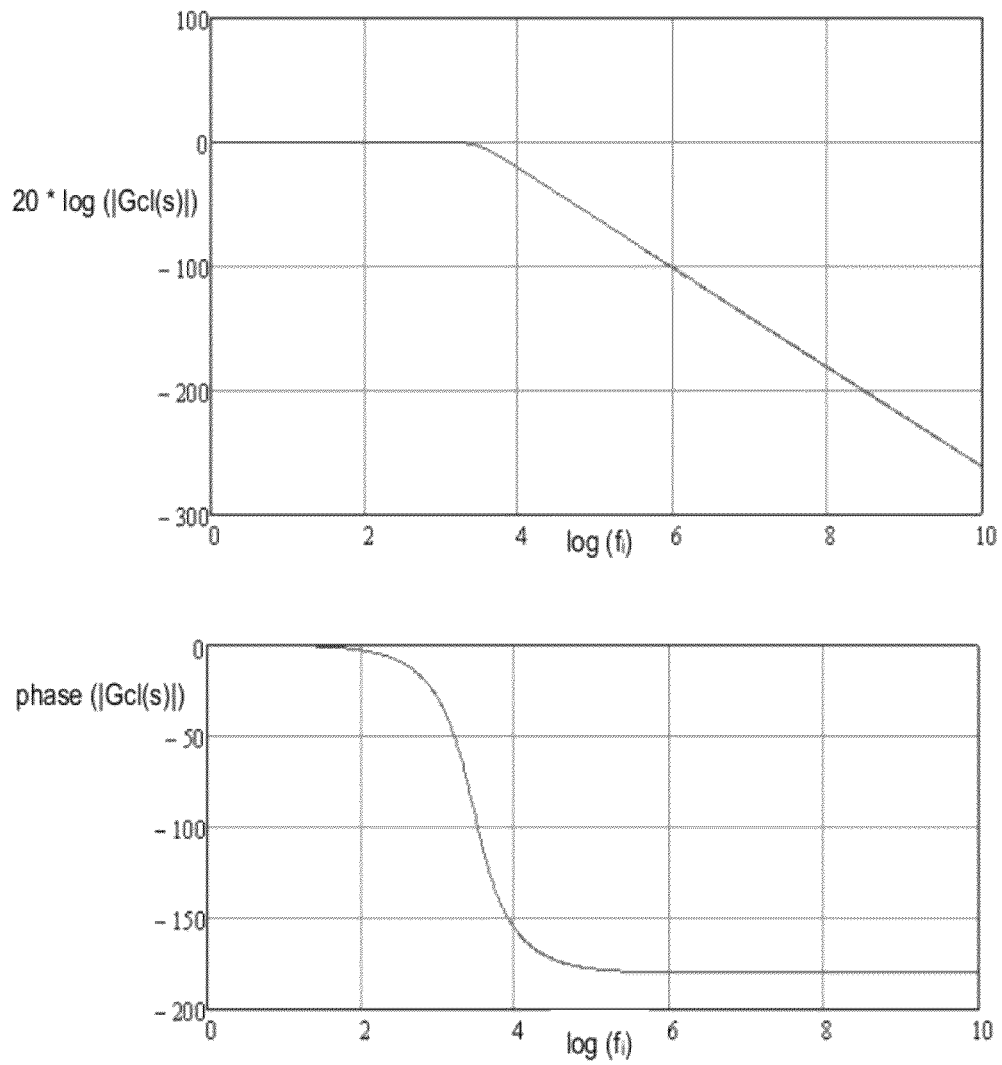
FIG. 2C illustrates a closed-loop frequency response of a DPLL in accordance with one embodiment of the present invention.

FIG. 2C depicts a closed loop response for a specific embodiment of DPLL 100 corresponding to Laplace model 200. FIG. 2C illustrates that in this embodiment, the magnitude response is a $3^{rd}$ order response. FIG. 2C also illustrates that the phase behavior resembles a second ordered response. This is because, in one embodiment, one numerator zero of the closed loop transfer function is designed to nearly overlay one denominator pole. This simplifies the response behavior and yet allows zero error to be maintained by the presence of an integral term in the transfer function of the embodiment of DEA 110 modeled by block C 210.

Figure 2D:
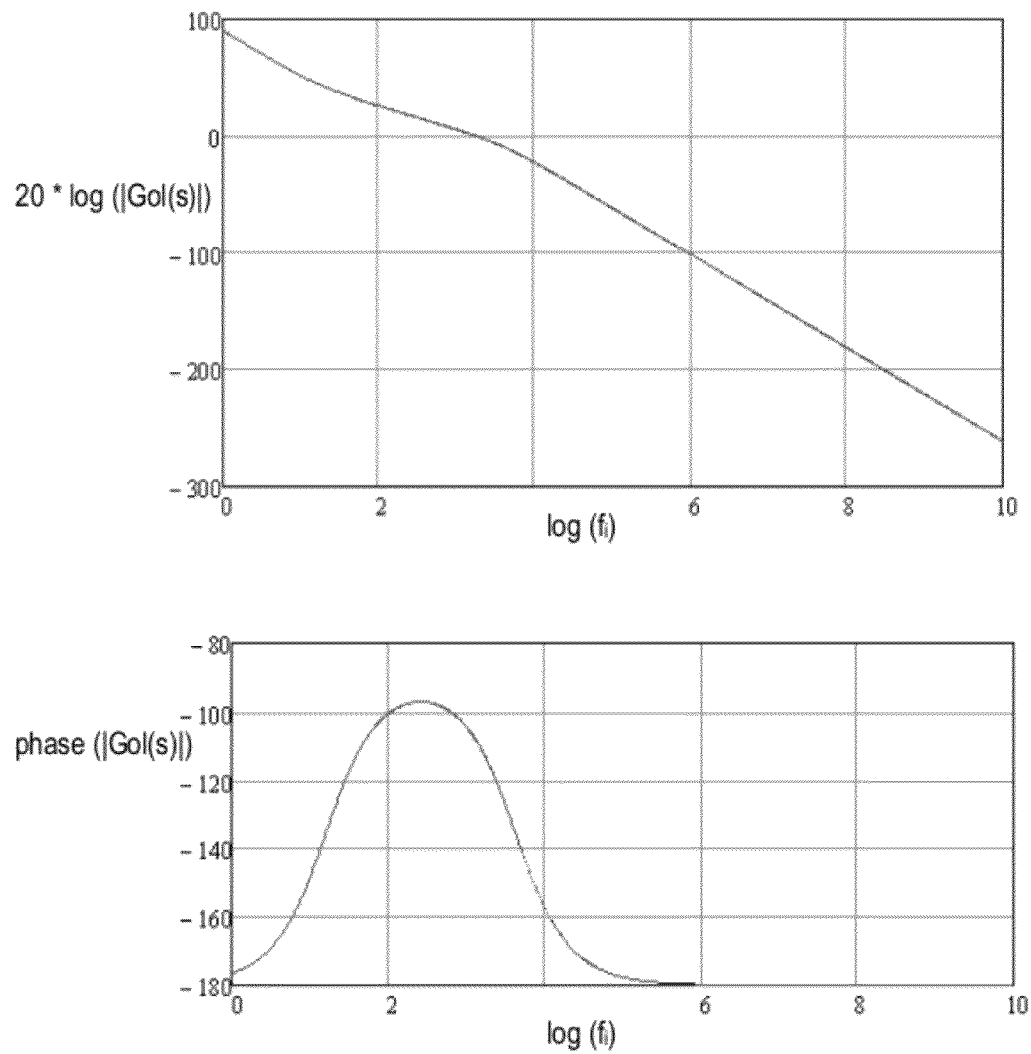
FIG. 2D illustrates an open-loop frequency response of a DPLL in accordance with one embodiment of the present invention.

FIG. 2D depicts the open loop response of one embodiment of DEA 110 and demonstrates the compensation that causes the phase margin to be optimized for operation with maximum bandwidth.

Figure 2E:
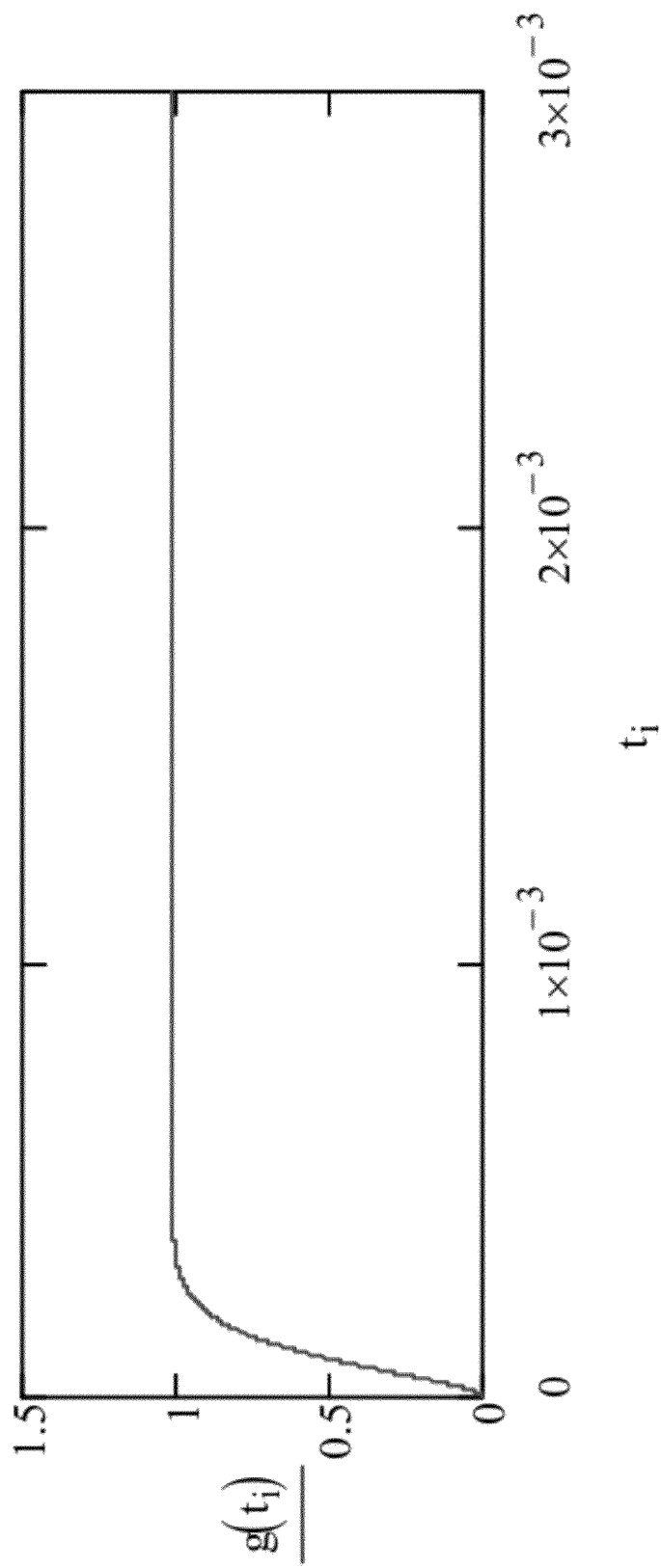
FIG. 2E illustrates a closed-loop step response of a DPLL in accordance with one embodiment of the present invention.

FIG. 2E depicts the time-domain closed loop step response for Laplace model 200 and corresponding DPLL 100. FIG. 2E is based on an inverse Laplace transform of the closed loop response seen in FIG. 2C. FIG. 2E demonstrates that DPLL 100 can be designed to achieve lock approximately 1 millisecond after receiving a step input.

Figure 3A:
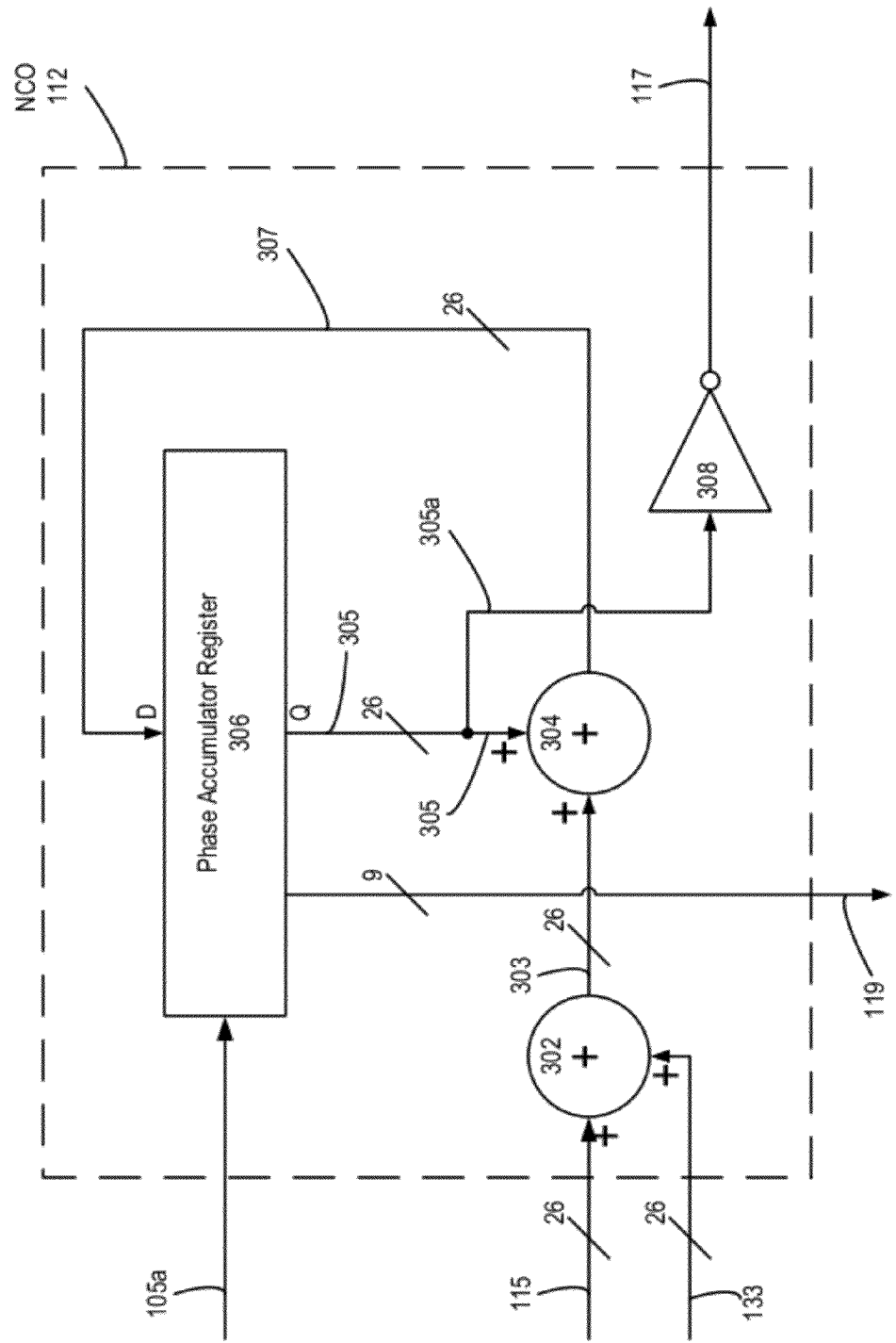
FIG. 3A illustrates a numerically controlled oscillator (NCO) in accordance with one embodiment of the present invention.

FIG. 3A illustrates NCO 112 according to one embodiment of the present invention. NCO 112 includes a phase accumulator register (PAR) 306, adder 302, adder 304, and inverter 308. PAR 306 is a conventional N-bit register that stores a binary number, referred to hereinafter as a PAR value. In one embodiment, PAR 306 is a 26-bit register and stores a 26-bit PAR value. PAR 306 is clocked by the reference phase 105a and produces both the primary oscillator output 117 and the secondary oscillator output 119.

Specifically, the primary oscillator output 117 varies in frequency based on the control signal 115 received from DEA 110 and the frequency set value 133 received from frequency set register 120. In order to generate the primary oscillator output 117, adder 302 sums the control signal 115 and the frequency set value 133 to output a phase increment value (PIV) 303. Adder 304 sums the PIV 303 with a current PAR value 305 to output a subsequent PAR value 307. In one embodiment, PAR 306 loads the subsequent PAR value 307 upon a rising edge of the reference phase 105a. In other embodiments, PAR 306 may load the subsequent PAR value 307 upon a falling edge of the reference phase 105a. Each cycle of the reference phase 105a causes the contents of PAR 306 to be overwritten with the sum of the previous PAR value and the PIV 303.

Hence, the current PAR value 305 increases by the PIV 303 at each cycle of reference phase 105a. Periodically, the current PAR value 305 reaches and exceeds the maximum number storable by PAR 306, at which point the contents of PAR 306 roll over. The frequency at which PAR 306 rolls over is determined by the PIV 303 (and therefore by the control signal 115 and the frequency set value 133) and the size of PAR 306. As the PIV 303 fluctuates around the frequency set value 133 by an amount dependent upon the control signal 115, the frequency set value 133 corresponds to the center frequency, or default frequency, of NCO 112. When PAR 306 rolls over, the most-significant-bit of PAR 306, referred to hereinafter as PAR-MSB 305a, transitions from 1 to 0. Hence, over time, the variation of the PAR-MSB 305a comprises a waveform having a frequency equal to the PAR 306 rollover frequency. The PAR-MSB 305a is routed as an input to inverter 308. The output of inverter 308 represents the primary oscillator output 117 and is a waveform that has a frequency equal to the PAR 306 rollover frequency and exhibits a rising edge upon PAR 306 rollover.

Figure 3B:
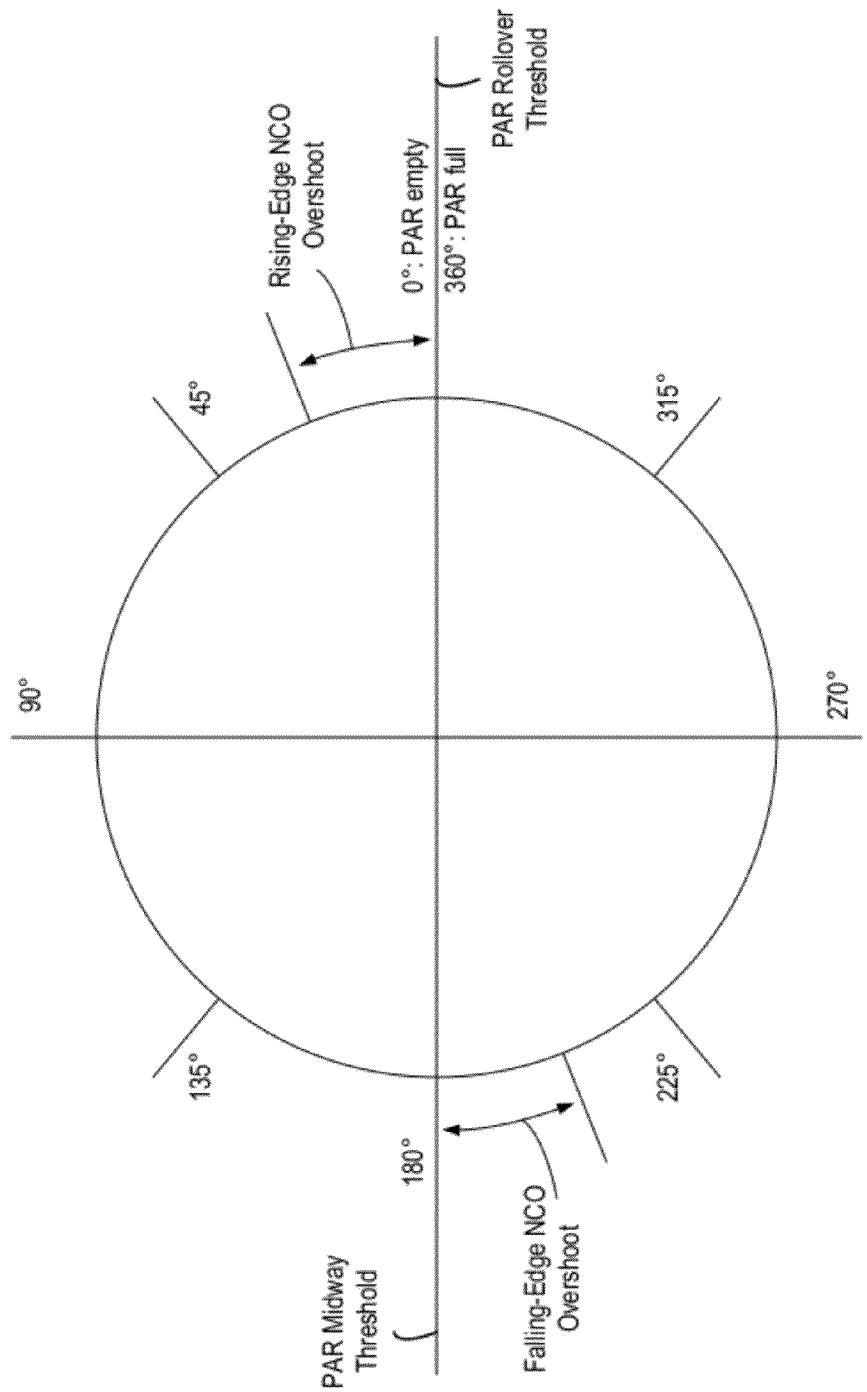
FIG. 3B illustrates one manner in which the contents of a phase accumulator register can be represented in terms of phase of an oscillator output.

Referring now to FIG. 3B, the manner in which the contents of PAR 306 can be represented in terms of phase of the primary oscillator output 117 is illustrated. In one embodiment, the binary number stored by the PAR 306 (FIG. 3A) corresponds to an angle between zero and 360 degrees of primary oscillator output 117 phase. When PAR 306 is empty (e.g., all bits are zeros), the phase of the primary oscillator output 117 is zero degrees. When PAR 306 is full (e.g., all bits are ones), the phase of the primary oscillator output 117 is 360 degrees. When PAR 306 is halfway to rolling over, (e.g., all bits except the PAR-MSB 305a are ones), the phase of the primary oscillator output 117 is 180 degrees. Hence, as the contents of PAR 306 move from zero to 360 degrees, the PAR-MSB 305a experiences two transitions. The PAR-MSB 305a experiences a rising edge at the PAR midway threshold (180 degrees) and a falling edge at the PAR rollover threshold (360 degrees). Hence, due to inverter 308, the primary oscillator output 117 experiences a falling edge at the PAR midway threshold (180 degrees) and a rising edge at the PAR rollover threshold (360 degrees).

However, as described above, the current PAR value 305 increments in discrete steps according to the PIV 303. Hence, when the PAR 306 rolls over, the resulting current PAR value 305 may not correspond exactly to zero degrees. For example, if the current PAR value 305 corresponds to 350 degrees and the PIV 303 corresponds to 15 degrees, upon the subsequent reference phase 105a cycle, PAR 306 will roll over, but the current PAR value will correspond to 5 degrees. Such a scenario can be described as exhibiting a "rising-edge NCO overshoot" of 5 degrees. PAR 306 exhibits similar behavior at the PAR midway threshold, resulting in a "falling-edge NCO overshoot." As used hereinafter, the term "NCO overshoot" refers to the amount, either in terms of a current PAR value 305 or a corresponding phase, by which contents of PAR 306 exceed either zero or 180 degrees upon crossing either the PAR midway threshold or the PAR rollover threshold.

Referring back to FIG. 3A, in one embodiment of the present invention, the secondary oscillator output 119 is generated by outputting the most-significant nine bits of the current PAR value 305. In other embodiments, the secondary oscillator output 119 comprises fewer, more, and/or different number bits of the current PAR value 305. The secondary oscillator output 119 provides information regarding NCO overshoot. Over a period of the reference frequency 111, PAR 306 rolls over multiple times. The cumulative effect of multiple rollovers and the associated NCO overshoots results in a phase error (or alternatively time error) in which the edges of the primary oscillator output 117 do not properly correspond to zero or 180 degrees, a non-ideality referred to hereinafter as "jitter."

In one embodiment, first phase accuracy extender 116a uses the timing references provided by the 8-phase clock 105 and the NCO overshoot information provided by the secondary oscillator output 119 to delay the edges of the primary oscillator output 117 as necessary to reduce jitter exhibited by the primary oscillator output 117. In one embodiment, first phase accuracy extender 116a aligns an edge of the primary oscillatory output 117 with one of the phases of the 8-phase clock 105.

Operation of one embodiment of first phase accuracy extender 116a is illustrated by the following example. In this example, the reference phase 105a has a frequency of 500 MHz and a period of 2 nsec. The desired frequency of the phase-enhanced feedback signal 127 is 165 MHz, therefore requiring a period of 6.0606 nsec. The corresponding PIV 303 can be calculated by solving the following equation, in which $F_o$ is the phase-enhanced feedback signal 127 frequency, $F_s$ is the reference phase 105a frequency, and N is the dimension of PAR 306. In this example, PAR 306 is a 26 bit register. Hence, this illustrative example results in a hexadecimal PIV 303 of 151EB85 (118.8° if a PAR value of 3FFFFFF is taken as 360°). Hence, an initially cleared PAR 306 will subsequently have values of 151EB85 (118.8°), 2A3D70A (237.6°), 3F5C28F (356.4°), 147AE14 (115.2°), and 2999999 (234°)....

A first PAR 306 transition from 151EB85 (118.8°) to 2A3D70A (237.6°) can be considered. The first transition exhibits a falling-edge NCO overshoot of 57.6°. The objective is to more precisely place the edges on 2 nsec boundaries. The first transition should have occurred at precisely (6.06 nsec×½ cycle)/(2.0 nsec/clock) which results in 1.51 clock cycles. The ½ cycle factor accounts for the first transition corresponding to 180 degrees. However, rather than occurring at 180 degrees, the transition occurred at 237.6 degrees, 57.6 degrees late. However, the PAR value before the transition, 151EB85 (118.8°), was 61.2 degrees early. Even though the edge occurs at 237.6 degrees, the edge can be considered as having happened one iteration early, allowing it to always be corrected with a positive delay. Hence, in this example, the edge can be considered to have occurred at 118.8 degrees, when in fact it should have occurred at 180 degrees. The edge location can be subtracted from the desired edge location (180−118.8 degrees yielding a result of 61.2 degrees). Dividing the subtraction result of 61.2 degrees by the step size of 118.8 degrees yields 0.51 clock cycles. Hence, a delay corresponding to the subtraction and division results can be added to the edge location to precisely place the edge where at the desired 1.51 clock cycles.

For an example of a PAR rollover event, a second PAR 306 transition from 3F5C28F (356.4°) to 147AE14 (115.2°) can be considered. The second transition exhibits a rising-edge NCO overshoot of 115.2°. Again, the PAR-MSB 305a doesn't transition until PAR 306 iterates to 147AE14 (115.2°), but the transition can be considered as having occurred one iteration earlier at 3F5C28F (356.4°) so that a positive delay can be added. The edge location can be subtracted from the desired edge location (360−356.4 degrees for a result of 3.6 degrees). Dividing the subtraction result of 3.6 degrees by the step size of 118.8 yields 0.0303 clock cycles. 0.0303 clock cycles, if added to the three clock cycles required for PAR 306 to iterate to 3F5C28F (356.4°), yields the desired 3.03 clock cycles. 3.03 clock cycles multiplied by 2 nsec/clock cycle yields a correct cycle time of 6.06 nsec. Similarly, the rising-edge overshoot of 115.2 degrees can be divided by the step size of 118.8 degrees, yielded 0.969 clock cycles. By subtraction 0.969 clock cycles from 1, the same 0.0303 clock cycle could be obtained.

Figure 4A:
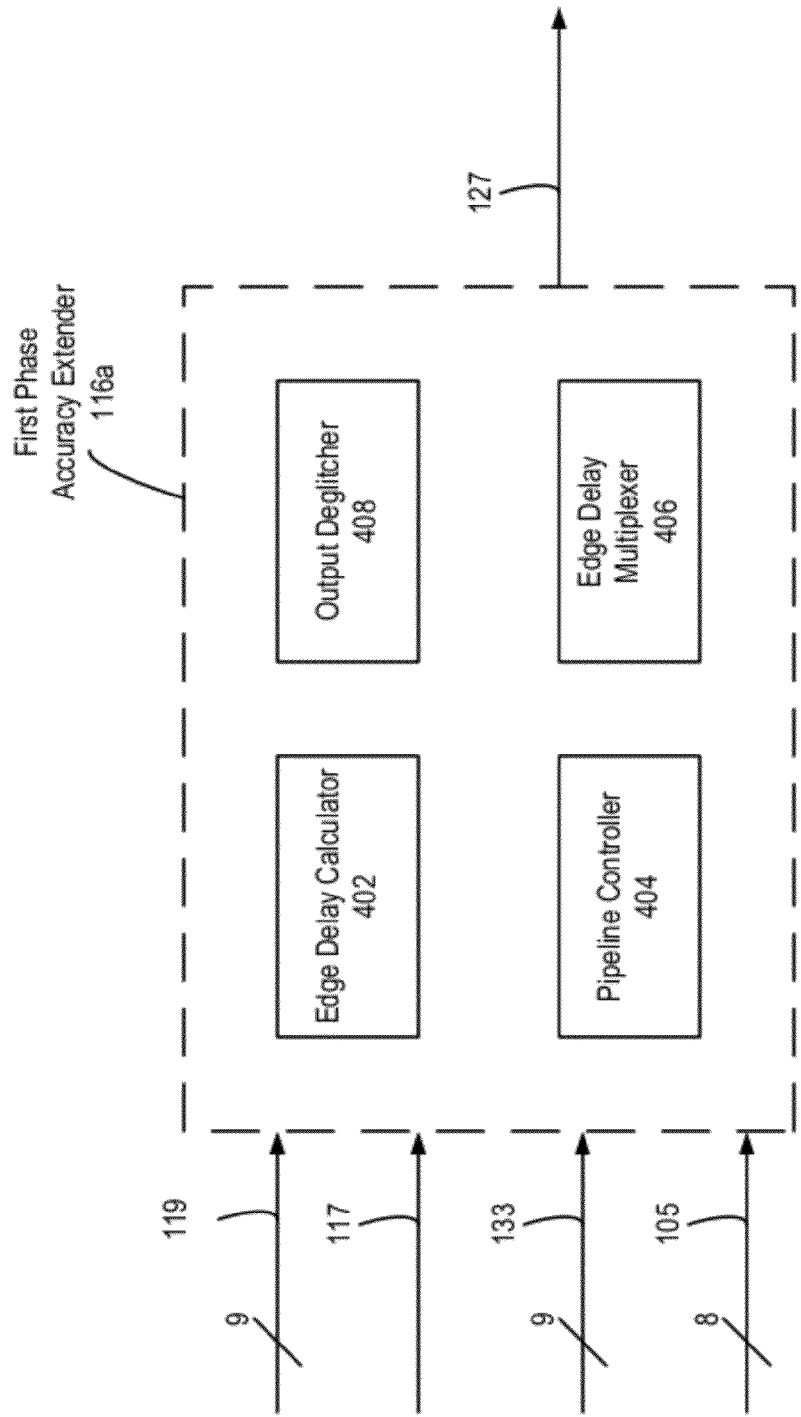
FIG. 4A illustrates a block diagram of a phase accuracy extender circuit in accordance with one embodiment of the present invention.
Figure 4B:
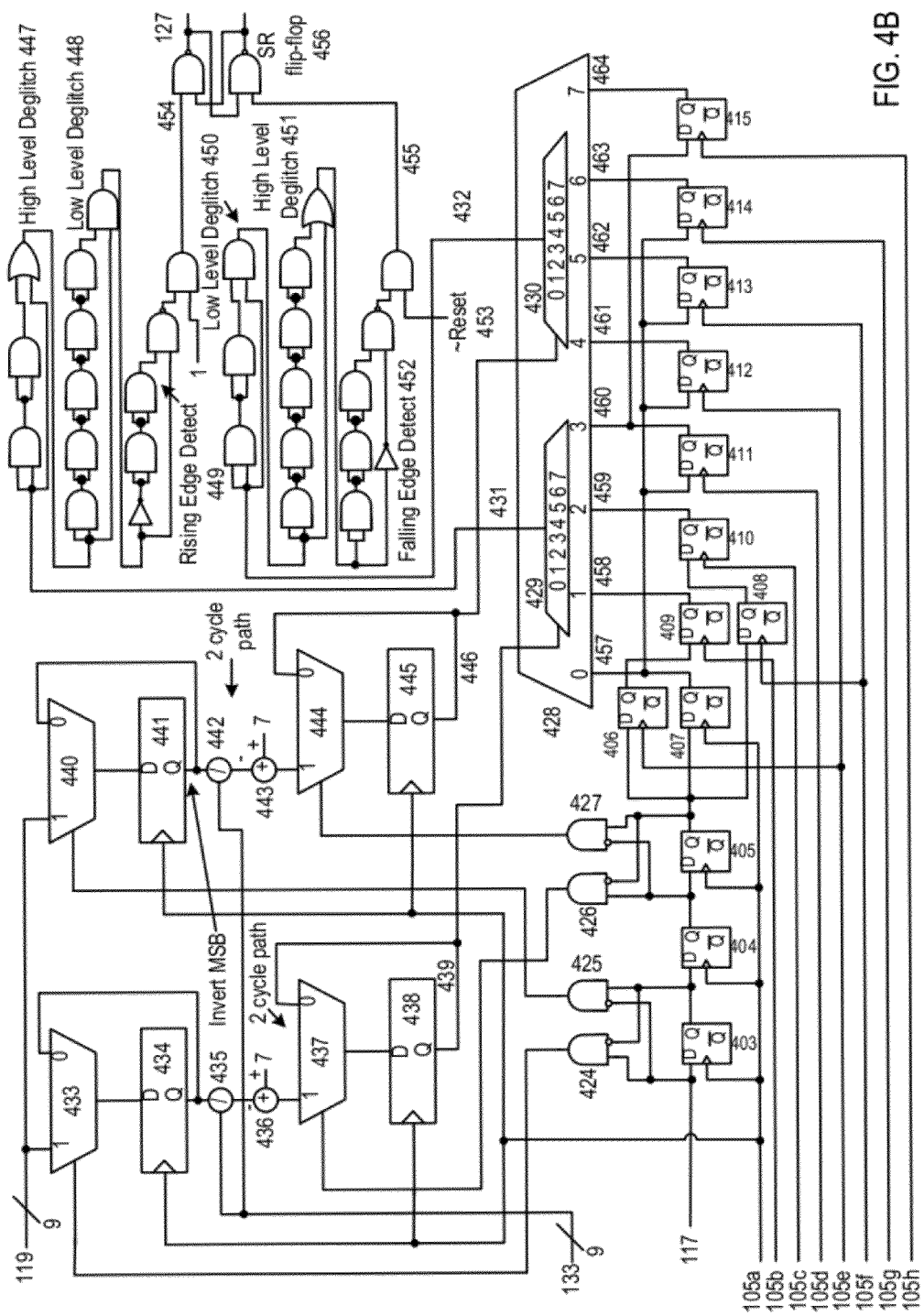
FIG. 4B illustrates a schematic of a phase accuracy extender circuit in accordance with one embodiment of the present invention.

There are slight differences between the math of the example presented above and what happens in the hardware of FIG. 4B. First, instead of working in degrees, first phase accuracy extender 116a operates in terms of MSB's of PAR 306 (the secondary oscillator output 119). Second, first phase accuracy extender 116a quantifies the result of the division to a 3 bit result that represents a jitter-enhancement delay in terms of $\frac{1}{8}^{th}$-cycle steps of the reference phase 105a. Thirdly, first phase accuracy extender 116a adds an offset phase delay of $\frac{7}{8}^{th}$ to the equation so the jitter-enhancement delay will never become negative, the result always indicating a positive delay. Also, first phase accuracy extender 116a applies a pipelining operation.

FIG. 4A is a block diagram illustrating first phase accuracy extender 116a according to one embodiment of the present invention. First phase accuracy extender 116a includes an edge delay calculator 402, pipeline controller 404, edge delay multiplexer 406, and output deglitcher 408. First phase accuracy extender 116a accepts four inputs: the primary oscillator output 117, the secondary oscillator output 119, the frequency set value 133, and the 8-phase clock 105. First phase accuracy extender 116a outputs the phase-enhanced feedback signal 127.

Edge delay calculator 402 calculates a jitter-enhancement delay to apply to each edge, both rising and falling, of the primary oscillator output 117. As part of calculating the jitter-enhancement delay, edge delay calculator 402 stores the secondary oscillator output 119 upon a rising edge of the primary oscillator output 117 and stores the secondary oscillator output 119 upon a falling edge of the primary oscillator output 117. The jitter-enhancement delay is calculated in terms of phases of the 8-phase clock 105. For example, edge delay calculator 402 can calculate the jitter-enhancement delay as corresponding to two phases of the 8-phase clock 105.

Pipeline controller 404 is clocked by the 8-phase clock 105 and samples the primary oscillator output 117 at various delays in term of reference phase 105a cycles. Pipeline controller 404 thereby captures the state of the primary oscillator output 117 at each phase of the 8-phase clock 105. Edge delay multiplexer 406 captures and outputs a phase-enhanced signal corresponding to the primary oscillator output 117 synchronized with a particular phase of the 8-phase clock 105. For example, if the jitter-enhancement delay calculated by edge delay calculator 402 indicates that a delay of two $\frac{1}{8}^{th}$ cycles of the reference phase 105a, in one embodiment the phase-enhanced signal corresponds to the primary oscillator output 117 with edges shifted to align with the third phase of the 8-phase clock 105 (the third phase being delayed two $\frac{1}{8}^{th}$ cycles relative to the reference phase 105a). Edge delay multiplexer 406 captures and outputs such phase-enhanced signals for both falling and rising edges of the primary oscillatory output 117. Both phase-enhanced signals output by the edge delay multiplexer 406 can include glitches. These are removed by output deglitcher 408, resulting in the phase-enhanced feedback signal 127.

Further operational and schematic details of one embodiment of first phase accuracy extender 116a are illustrated in FIG. 4B. Edge delay calculator 402 comprises multiplexers 433, 437, 440, and 444, registers 434, 438, 441, and 445, dividers 435 and 442, as well as adders 436 and 443. Pipeline controller 404 comprises registers 403, 404, 405, 406, 407, 408, 409, 410, 411, 412, 413, 414, 415 and NAND gates 424, 425, 426, 427. Edge delay multiplexer 406 comprises multiplexer 428. Output deglitcher 408 comprises high level deglitch circuit 447, low level deglitch circuit 448, rising edge detect circuit 449, low level deglitch circuit 450, high level deglitch circuit 451, falling edge detect circuit 452, and SR flip flop 456.

As illustrated in FIG. 4B, there is a delay of 3 cycles of the reference phase 105a cycles introduced to the input of the primary oscillator output 117 by D-flip flops 403, 404, 405. NAND gate 424 detects a leading edge of the primary oscillator output 117 without a delay. NAND gate 425 detects a lagging edge of the primary oscillator output 117 without a delay. NAND gate 426 detects a leading edge of the primary oscillator output 117 with a delay of two cycles of the reference phase 105a. NAND gate 427 detects a lagging edge of the primary oscillator output 117 with a delay of two cycles of the reference phase 105a. The total delay before the reference phase 105a reaches the phase-0 input of multiplexer (MUX) 428 from D-flip flop 407 is 4 cycles of the reference phase 105a.

On the rising edge of the primary oscillator input 117, MUX 433 directs the secondary oscillatory input 119 into register 434, where it is stored. Similarly, on the falling edge of the primary oscillator input 117, MUX 440 directs the secondary oscillatory input 119 into register 441, where it is stored. Following registers 434 and 441 are dividers 435, 442 that divide the secondary oscillator input 119 by the phase offset value 133, producing a 3 bit result. The 3 bit result is subtracted from seven (ensuring a positive final result) at the adders 436, 443. The final result is passed to registers 438 and 445 through multiplexers 437 and 444, for a rising or falling edge calculation respectively. MUX 437 is enabled two reference phase 105a cycles after MUX 433. This allows two full cycles of the reference phase 105a for the rising edge arithmetic operation to completely settle and be latched into register 438. MUX 444 is enabled two reference phase 105a cycles after MUX 440, allowing 2 full clock reference phase 105a cycles for the falling edge arithmetic operation to completely settle and be latched into register 445.

Due to the above-described pipelining operation and addition of seven, the total time delay applied to any edge of the primary oscillator output 117 is $4+n/8$, where n is the final result of (1) left shifting the secondary oscillator output 119 by 3 bits, (2) dividing the shifted result by the PIV 303, and (3) subtracting the divided result from seven. The pipelining allows a simple divider followed by a small-area ripple-carry subtract operation to execute the above-described arithmetic.

As described above, the primary oscillator output 117 is delayed by registers 403, 404, 405, 406, 407 before reaching the phase-0 input of MUX 428. Registers 409, 410, 411, 412, 413, 414, 415 provide seven additional inputs based on the other seven phases of the 8 phase clock 105. In order to allow sufficient setup time for register 409, register 406 provides register 409 with a version of the primary oscillator output 117 that is sampled using the fourth phase 105e of the 8-phase clock 105, as its edges are offset one half-cycle from those of the reference phase 105a. Register 408 similarly provides register 410 with a version of the primary oscillator output 117 that is sampled using the fifth phase 105f of the 8-phase clock 105, as its edges are offset one half-cycle from those of the second phase 105b.

Registers 407, 409, 410, 411, 412, 413, 414, 415 use the phases of the 8-phase clock 105a, 105b, 105c, 105d, 105e, 105f, 105g, 105h, respectively, as their respective clock signals to provide 8 phases of the primary oscillator output 117 (with the modifications by registers 406, 408 to the phase 1 and phase 2 inputs of MUX 428) as inputs to MUX 428 at 8 different phase-delayed timings. MUX 428 includes two 8-input multiplexers 429, 430 that operate on the chosen rising and falling phase of the primary oscillator output 117 respectively. Signal 431 is the MUX 428 output signal for the rising edge of the primary oscillator output 117. Signal 432 is the MUX 430 output signal for the falling edge of the primary oscillator output 117. However, due to changes in signals 439 and 446 which control MUX 429 and MUX 430, signals 431 and 432 can contain glitches.

Output deglitcher 408 removes glitches from signals 431 and 432 while preserving edge locations (in one embodiment, with an acceptable fixed delay). For signal 431, this is accomplished with high level deglitch circuit 447 followed by low level deglitch circuit 448. For signal 432, this is accomplished by low level deglitch circuit 450 followed by high level deglitch circuit 451. Since high level deglitch circuits 447, 451 remove a glitch from a high level signal, but widens a glitch in a low level signal, low level deglitch circuit 448, which follows high level deglitch circuit 447 is configured to remove larger glitches than the high level deglitch circuit 447. For similar reasons, high level deglitch circuit 451 is configured to remove larger glitches than low level deglitch circuit 450.

Rising edge detector 449 follows low level deglitch circuit 448 and outputs signal 454. Falling edge detector 452 follows high level deglitch circuit 451 and outputs signal 455. Signals 454 and 455 drive the SR flip flop 456. SR flip flop 456 outputs a phase-enhanced feedback signal 127 which is equal in frequency to the primary oscillatory output 117, but with both rising and falling edge jitter attenuated to $\frac{1}{8}^{th}$ of a reference phase 105a cycle.

Figure 4C:
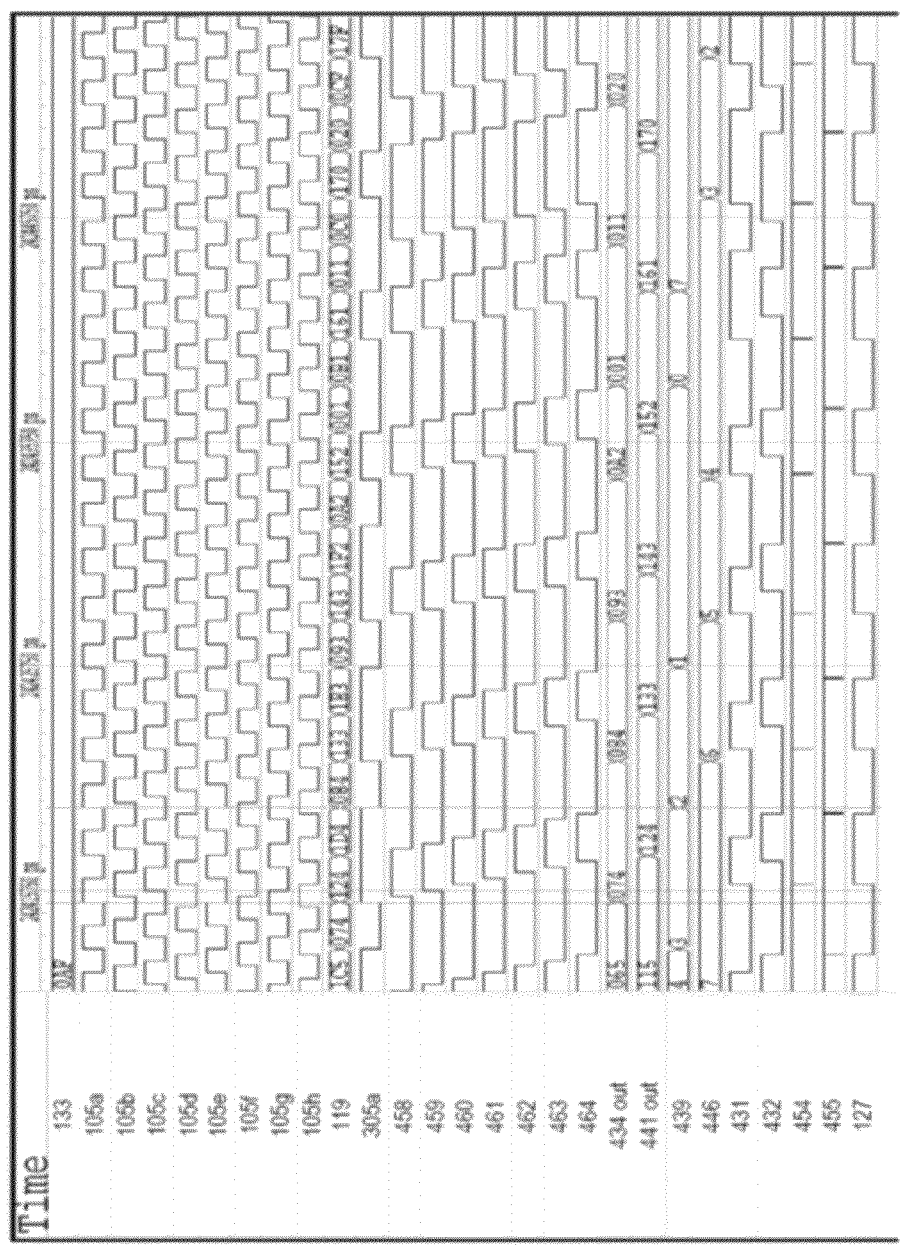
FIG. 4C illustrates operational waveforms of a phase accuracy extender circuit in accordance with one embodiment of the present invention.

FIG. 4C is a timing diagram of the operation of first phase accuracy extender 116a according to one embodiment of the present invention. FIG. 4C illustrates inputs to first phase accuracy extender 116a including the phases of the 8 phase clock 105a, 105b, 105c, 105d, 105e, 105f, 105g, 105h and the secondary oscillator output 119. FIG. 4C also shows the frequency set value 133 (9-bits wide in the embodiment of FIG. 4C). Additionally, FIG. 4C shows the PAR-MSB 305a which, as shown in FIG. 3A, is the inverse of the primary oscillator output 117. Hence, FIG. 4C shows the correspondence between the PAR-MSB 305a and the most significant bit of the secondary oscillator output 119. FIG. 4C illustrates signals internal to first phase accuracy extender including phase inputs to multiplexer 428 (458, 459, 460, 461, 462, 463, 464), the outputs of multiplexer 434 (434 out) and multiplexer 441 (441 out), the Q outputs of register 438 (439) and register 445 (446), both outputs of multiplexer 428 (431, 432), and both inputs to SR flip flop 456 (454, 455). FIG. 4C also illustrates the phase-enhanced feedback signal 127.

Figure 4D:
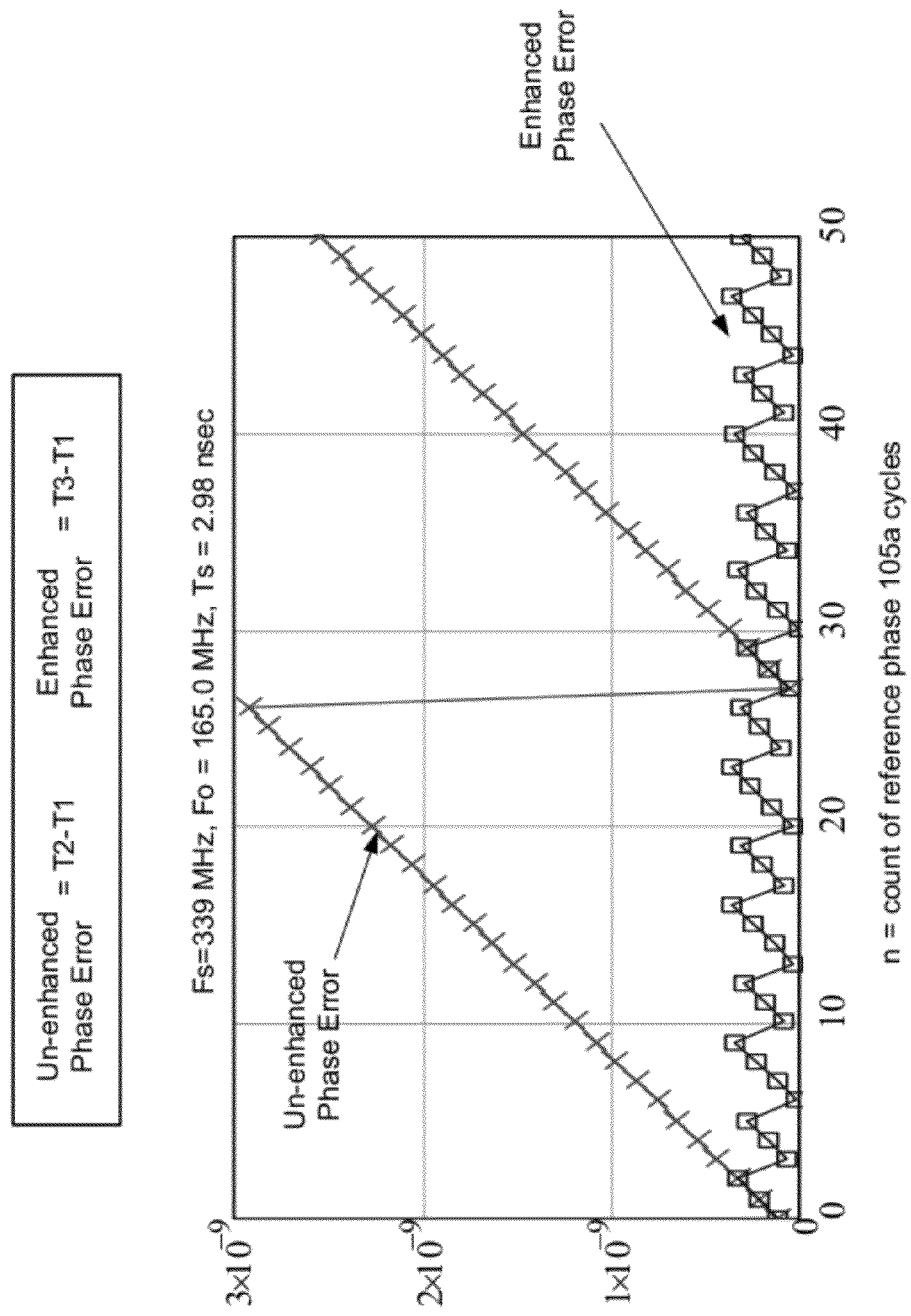
FIG. 4D illustrates jitter performance of a DPLL in accordance with one embodiment of the present invention.

FIG. 4D is a plot demonstrating simulated jitter attenuation achieved by one embodiment of first phase accuracy extender 116a. As described above, if the PIV 303 is a number that is not integer divisible into, then each time PAR 306 rolls over, it will land at a different point, causing the phase error to increase in time over the duration of a reference frequency 111 period. As shown in FIG. 4D, the phase error, or actually the time error, increases with each reference phase 105a cycle until it reaches almost a full reference frequency 111 period. At that point, phase error resets to near 0 and begins to ramp again. This represents jitter. In the figure, T1 represents the ideal time for an edge of the primary oscillator output 117. T2 represents the times for the edge of the primary oscillator output 117 without any phase enhancement. Un-enhanced phase error represents the difference between T1 and T2. T3 represents the time for the edge after phase enhancement by first phase accuracy extender 116. Enhanced phase error represents the difference between T1 and T3. FIG. 4 illustrates that peak-to-peak phase error is reduced to $\frac{1}{8}^{th}$ of a reference frequency 111 period, corresponding to reduced jitter.

Figure 5:
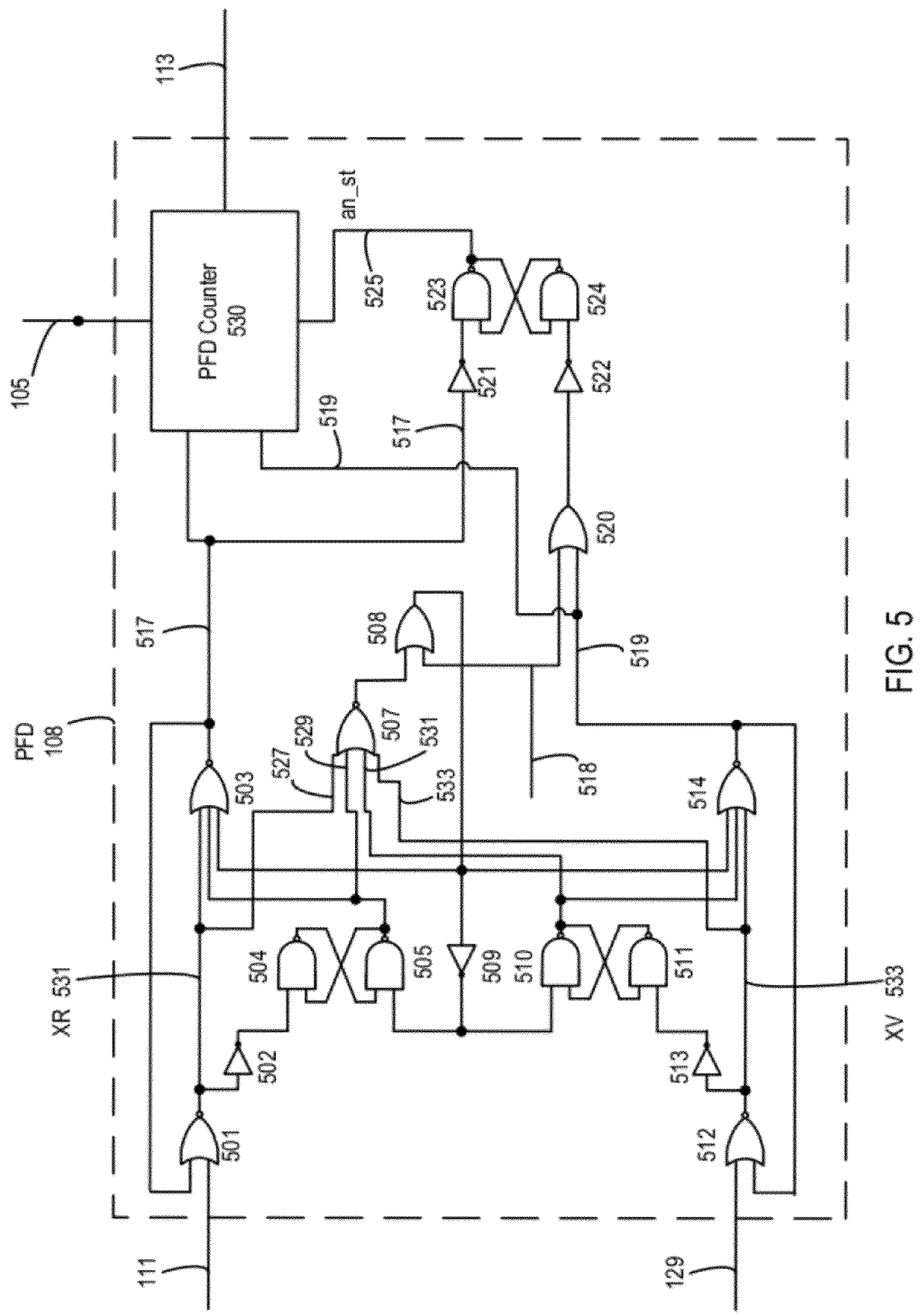
FIG. 5 illustrates a phase frequency detector in accordance with one embodiment of the present invention.

FIG. 5 illustrates one embodiment of PFD 108 in accordance with the present invention. As described above in reference to FIG. 1, inputs to the PFD 108 include the reference frequency 111, the divided DPLL feedback signal 129, and the 8-phase clock 105. In one embodiment, PFD 108 also accepts a reset signal 518 as an input. In one embodiment, the reset signal 518 is generated upon system power-up. Assertion of the reset signal 518 causes both signals 517 and 519 to go low, establishing an initial (reset) condition for PFD 108. PFD 108 outputs the error signal 113 to DEA 110. Assertion of the reset signal 518 also, due to OR gate 520, establishes an initial condition for PFD counter 530 and the RS flip flop comprising NAND gates 523 and 524.

In one embodiment, PFD 108 monitors the phase of the reference frequency 111 and the phase of the divided DPLL feedback signal 129. The error signal 113 describes a difference between the phases monitored by PFD 108. Internally, PFD 108 includes phase analyzer circuitry which produces both an up signal 517 and a down signal 519. The up signal 517 is high any time that the phase of the reference frequency 111 leads the phase of the divided DPLL feedback signal 129. The down signal 519 is high anytime that the phase of the reference frequency 111 lags the phase of the divided DPLL feedback signal 129. In one embodiment, PFD 108 also includes PFD counter 530 which uses the 8-phase clock 105 to analyze the duration that either the up signal 517 or the down signal 519 is high.

PFD 108 generates the up signal 517 and the down signal 519 as follows. To establish an initial condition for operation, the reset signal 518 is asserted (set high). This causes the output of OR gate 508 to go high and the output of inverter 509 to go low. This signal sets the first RS flip flop (comprising NAND gates 504, 505) and sets the second RS flip flop (comprising NAND gates 510, 511), causing the outputs of NAND gate 505 and NAND gate 510 to go high and the outputs of NAND gate 504 and NAND gate 511 to go low. For the sake of illustrative example, it can be assumed that at this time both the reference frequency 111 and the divided DPLL feedback signal 129 are low. Hence, the outputs of NOR gates 501 (XR signal 531) and NOR gate 512 (XV signal 533) are both high. Therefore the outputs of inverter 502 and inverter 513 are both low. Assuming that the reset signal 518 has returned to a low state, this resets both the first RS flip flop (comprising NAND gates 504, 506) and the second RS flip flop (comprising NAND gates 510, 511), causing the outputs of NAND gate 505 and NAND gate 510 to go low. This establishes an initial condition for PFD 108. In the initial condition, the XR signal 531 and the XV signal 533 are both high. Also, all inputs to NOR gate 503 are low except the XR signal 531. Similarly, all inputs to NOR gate 514 are low except for the XV signal 533.

For the sake of illustration, it can be assumed that the reference frequency 111 goes high while the divided DPLL feedback signal 129 remains low, resulting in changes to many signals internal to PFD 108. The XR signal 531 goes low, and the up signal 517 goes high. At this point, the top 2 inputs 527, 529 to NOR gate 507 are low. At some later time, the divided DPLL feedback signal 129 goes high, resulting in additional changes to many signals internal to PFD 108. Specifically, the XV signal 533 goes low, and the down signal 519 goes high. At this point, all inputs 527, 529, 531, 533 to NOR gate 507 are low, causing the output of NOR gate 507 to go high. As a result, the output of OR gate 508 goes high and the output of inverter 509 goes low, returning the first RS flip flop (comprising NAND gates 504, 506) and the second RS flip flop (comprising NAND gates 510, 511) to their set state as described above. The setting of both the first RS flip flop and second RS flip flop pulls both the up signal 517 and the down signal 519 low.

The above-described scenario results in a pulse of finite width during which the up signal 517 is high and a glitch during which the down signal 519 is high. The pulse of the up signal 517 is related to the duration of time after the reference frequency 111 went high and before the divided DPLL signal 129 went high. An alternative scenario in which the divided DPLL signal 129 went high before the reference frequency 111 results in analogous behavior, producing a pulse of finite width during which the down signal 519 is high and a glitch during which the up signal 517 is high.

In either the case, one embodiment of PFD counter 530 measures in time the width of the up signal 517 pulse and the down signal 519 pulse to generate the error signal 113. The error signal 113 indicates the measured width of either the up signal 517 pulse or the down signal pulse 519 and ultimately specifies either an increase or a decrease in frequency needed for the primary oscillator output 117 to lock DPLL 100 in frequency and time. In one embodiment, PFD counter 530 determines which pulse width is reflected in the error signal based on an analog state signal 525. Further details of one embodiment of PFD counter 530 are provided below in reference to FIGS. 6A and 6B.

In one embodiment, PFD 108 includes a third RS flip flop (comprising NAND gates 523, 524) that monitors inverted versions (due to inverters 521 and 522) of the up signal 517 and the down signal 519 and outputs the analog state signal 525. As described above, one pulse, either the up signal 517 pulse or the down signal 519 pulse, is measurably wider and leads the other pulse in time; the other pulse is a glitch that lags the wider pulse in time. The analog state signal 525 is high as long as the reference frequency 111 leads the divided DPLL feedback signal 129 in phase. Similarly, the analog state signal 525 is low as long as the reference frequency 111 lags the divided DPLL feedback signal 129 in phase. An advantage of the embodiment of PFD 108 illustrated in FIG. 5 is that the time resolution of both the up signal 517 and the down signal 519 is equal to that of the reference frequency 111 and the divided DPLL feedback signal 129.

Figure 6A:
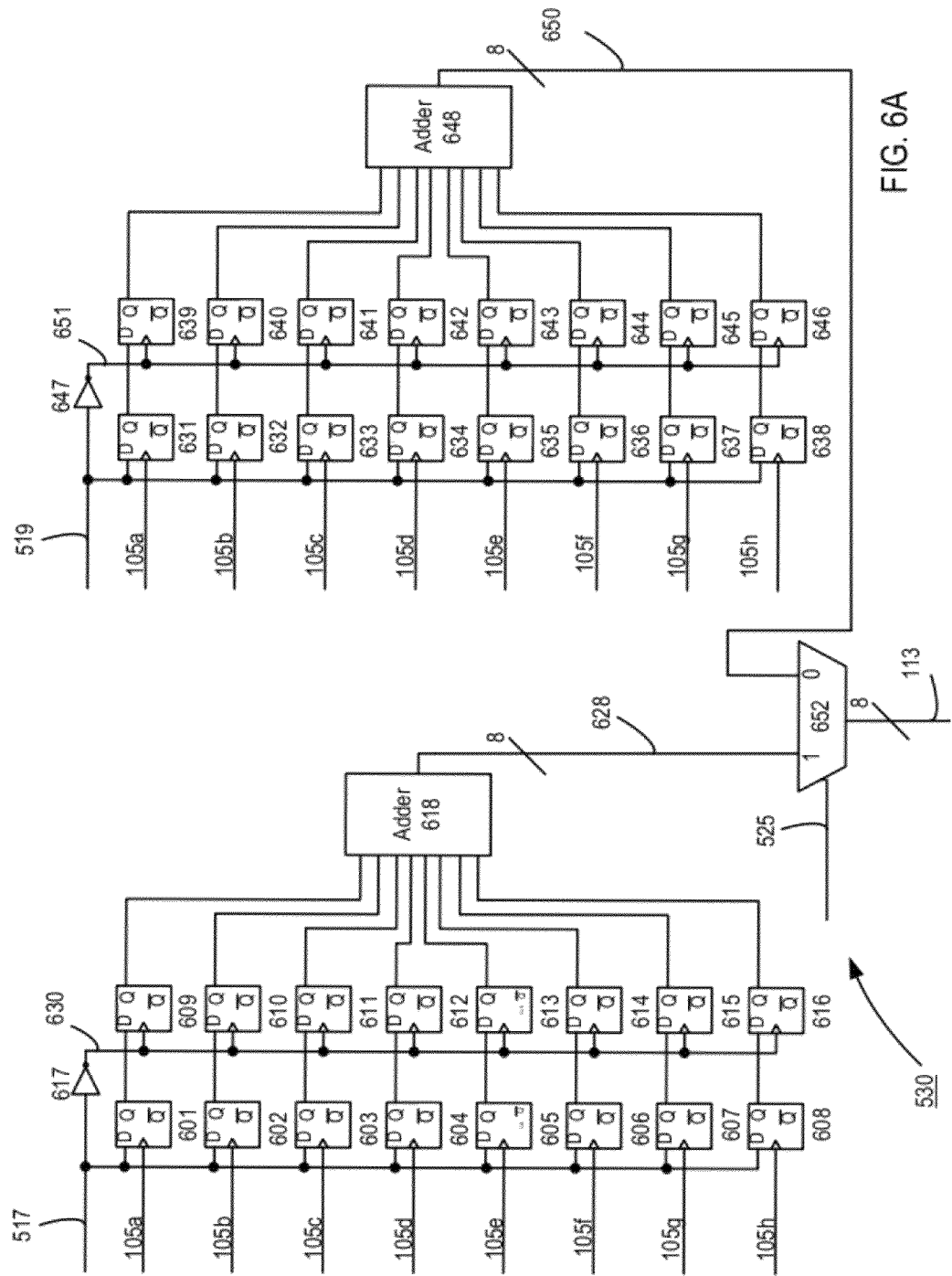
FIG. 6A illustrates a phase frequency detector counter in accordance with one embodiment of the present invention.

FIG. 6A illustrates one embodiment of PFD counter 530 in accordance with the present invention. PFD counter 530 includes an up counter circuit (comprising D-type flip flops 601, 602, 603, 604, 605, 606, 607, 608, 609, 610, 611, 612, 613, 614, 615, 616, inverter 617, and adder 618) and a down counter circuit (comprising D-type flip flops 631, 632, 633, 634, 635, 636, 637, 638, 639, 640, 641, 642, 643, 644, 645, 646, inverter 647, and adder 648).

The up counter circuit accepts the up signal 517 (see FIG. 5) and the 8-phase clock 105 as inputs and outputs an up phase count 628. The up counter circuit measures the width of up signal 517 pulses in terms of $\frac{1}{8}^{th}$ cycles of the reference phase 105a. The up signal 517 signal is routed to the D inputs of D-type flip flops 601, 602, 603, 604, 605, 606, 607, 608. During an up signal 517 pulse, these inputs are high. Hence, during an up signal pulse 517, a rising edge on any phase of the 8-phase clock 105 will cause the Q output of the corresponding D flip flop 601, 602, 603, 604, 605, 606, 607, 608 to go high. The up signal 517 is also input to inverter 617 which outputs an inverted up signal 630 pulse that is routed to the clock inputs of D flip flops 609, 610, 611, 612, 613, 614, 615, 616. The rising edge of the inverted up signal 630 pulse corresponds to the falling edge of the original up signal 517 pulse. Upon the rising edge of the inverted up signal 630 pulse (the falling edge of the original up signal 517 pulse), the values of the Q outputs of D flip flops 601, 602, 603, 604, 605, 606, 607, 608 are captured to the Q outputs of D flip flops 609, 610, 611, 612, 613, 614, 615, 616. Hence, the number of Q outputs of D flip flops 609, 610, 611, 612, 613, 614, 615, 616 that are high represents how many phases of the 8-phase clock 105 exhibited a rising edge during the up signal 517 pulse. The Q outputs of D flip flops 606 . . . 616 are routed to the inputs of adder 618. Adder 618 adds the number of high inputs to output an up phase count 628 that, as described above, represents how many phases of the 8-phase clock 105 exhibited a rising edge during the up signal 517 pulse. The up counter circuit repeats this operation for each up signal 517 pulse.

The down counter circuit functions in a similar fashion as the up counter circuit. However, it accepts as inputs the down signal 519 (see FIG. 5) and 8-phase clock 105 to output a down phase count 650 that represents how many phases of the 8-phase clock 105 exhibited a rising edge during a down signal 519 pulse. The down counter circuit measures the width of down signal 519 pulses in terms of $\frac{1}{8}^{th}$ cycles of the reference phase 105a. The down signal 519 signal is routed to the D inputs of D-type flip flops 631, 632, 633, 634, 635, 636, 637, 638. During a down signal 519 pulse, these inputs are high. Hence, during a down signal pulse 519, a rising edge on any phase of the 8-phase clock 105 will cause the Q output of the corresponding D flip flop 631, 632, 633, 634, 635, 636, 637, 638 to go high. The down signal 519 is also input to inverter 647 which outputs an inverted down signal 651 pulse that is routed to the clock inputs of D flip flops 639, 640, 641, 642, 643, 644, 645, 646. The rising edge of the inverted down signal 651 pulse corresponds to the falling edge of the original down signal 519 pulse. Upon the rising edge of the inverted down signal 651 pulse (the falling edge of the original down signal 519 pulse), the values of the Q outputs of D flip flops 631, 632, 633, 634, 635, 636, 637, 638 are captured to the Q outputs of D flip flops 639, 640, 641, 642, 643, 644, 645, 646. Hence, the number of Q outputs of D flip flops 639, 640, 641, 642, 643, 644, 645, 646 that are high represents how many phases of the 8-phase clock 105 exhibited a rising edge during the down signal 519 pulse. The Q outputs of D flip flops 639, 640, 641, 642, 643, 644, 645, 646 are routed to the inputs of adder 648. Adder 648 adds the number of high inputs to determine an intermediate phase count that, as described above, represents how many phases of the 8-phase clock 105 exhibited a rising edge during the down signal 519 pulse. In one embodiment, adder 648 includes conventional hardware to determine the two's compliment value of the intermediate phase count (not shown) and output a down phase count 650 that represents a negative number corresponding to the intermediate phase count. The down counter circuit repeats this operation for each down signal 519 pulse.

The up phase count 628 and the down phase count 650 are input to MUX 652 which receives the analog state signal 525 as a control input and outputs the error signal 113. If the analog state signal 525 is high, the error signal 113 corresponds to the up phase count 628. If the analog state signal 525 is low, the error signal 113 corresponds to the down phase count 650.

Figure 6B:
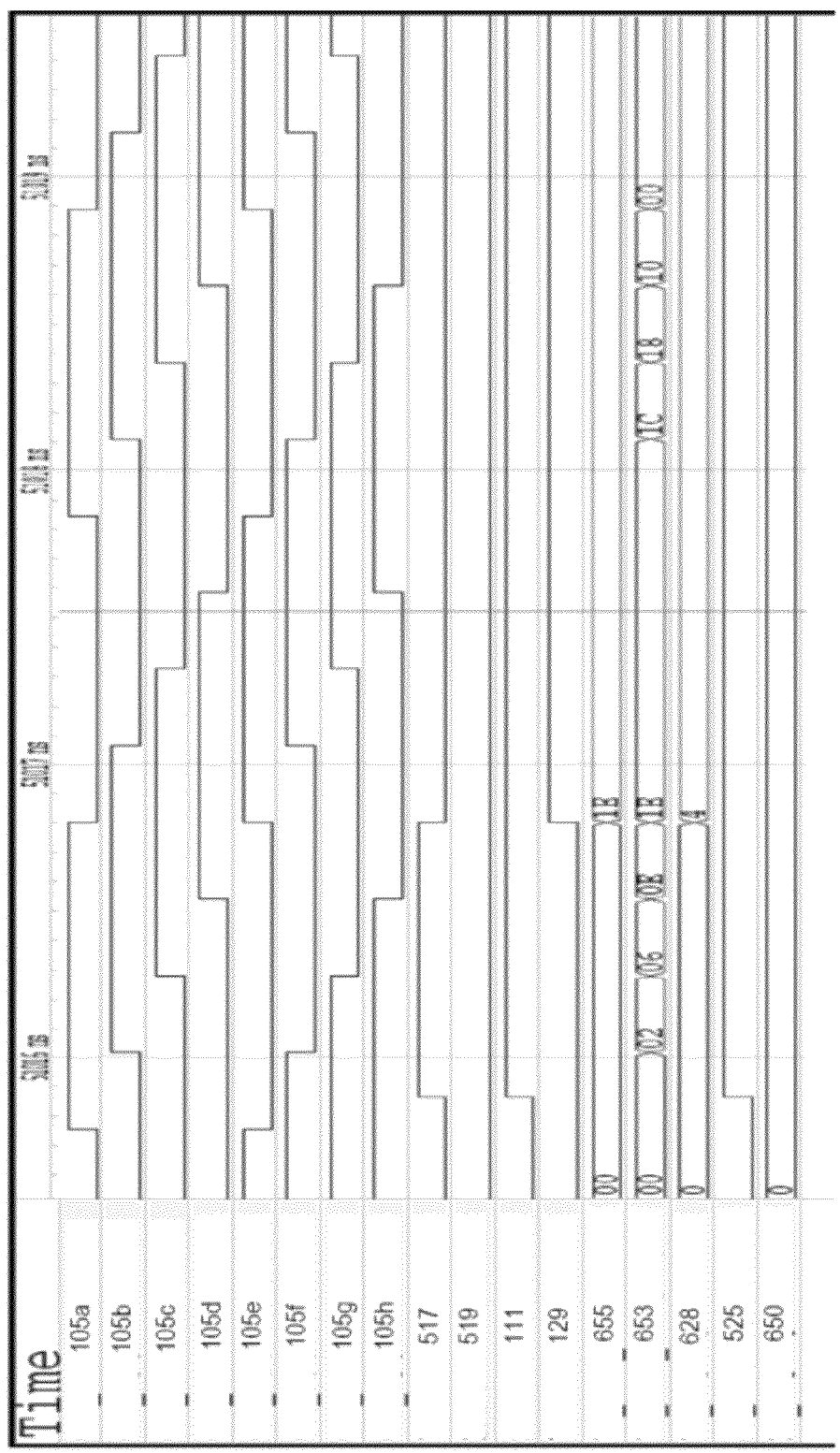
FIG. 6B illustrates operational waveforms of a phase frequency detector counter in accordance with one embodiment of the present invention.

FIG. 6B illustrates the operational waveforms of the PFD phase accuracy extension circuit of FIG. 6A. FIG. 6B illustrates a scenario in which the reference frequency 111 leads the divided DPLL feedback signal 129 by 4 phases of the 8-phase clock 105a, 105b, 105c, 105d, 105e, 105f, 105g, 105h. Signal 653, which comprises the 8-bit output of D flip flops 601, 602, 603, 604, 605, 606, 607, 608, has one bit set each time the rising edge of a phase of 8-phase clock 105 occurs. Then, at the falling edge of the up signal 517, one can see the transfer of the bits of signal 653 to signal 655, which comprises the 8-bit output of D flip flops 609, 610, 611, 612, 613, 614, 615, 616. Upon this transition, the up phase count 628 changes to four, indicating that reference frequency 111 exhibits a phase lead relative to the divided DPLL feedback signal 129 by four phases of the 8-phase clock 105. As the reference frequency 111 leads the divided DPLL feedback signal 129, there is no down pulse present on the down signal 519 and the down phase count 650 is zero throughout. Also, the analog state signal 525 is high, dictating that the up phase count 628 will correspond to the error signal 113.

Upon reading this disclosure, those of skill in the art will appreciate still additional alternative structural and functional designs for a system and a process for reducing jitter exhibited by an output of a phase lock loop through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:
1. A digital phase lock loop circuit, comprising:
a phase frequency detector configured to receive a reference frequency signal, a feedback signal derived from an output signal of the digital phase lock loop circuit, and a plurality of reference clock signals, the phase frequency detector configured to determine a phase difference between the feedback signal and the reference frequency signal to generate an error signal indicative of the phase difference;

a numerically controlled oscillator configured to receive the error signal and generate a first oscillator output signal with a frequency proportional to the error signal and a second oscillator output signal indicative of jitter of the first oscillator output signal in reference to the reference frequency signal; and a first phase accuracy extender configured to receive the first oscillator output signal, the second oscillator output signal, and the plurality of reference clock signals, the first phase accuracy extender determining a first delay amount from the second oscillator output signal and delaying the first oscillator output signal by the first delay amount to generate a phase-enhanced output signal with edges aligned with one of the plurality of reference clock signals.

2. The digital phase lock loop circuit of claim 1, wherein the phase frequency detector comprises:

a phase analyzer configured to receive the reference frequency signal and the feedback signal, the phase analyzer generating an up pulse with a first duration proportional to a phase lead of the reference frequency signal relative to the feedback signal and a down pulse with a second duration proportional to a phase lag of the reference frequency signal relative to the feedback signal; and a phase counter configured to received the up pulse and the down pulse and generate the error signal corresponding to the first duration or the second duration in terms of cycles of said one of the plurality of reference clock signals.

3. The digital phase lock loop circuit of claim 2, wherein the phase counter determines the first duration or the second duration in terms of cycles of one of the plurality of reference clock signals by determining a first digital count and a second digital count, the first digital count corresponding to a first number of the plurality of reference clock signals that experience a rising edge during the up pulse, and the second digital count corresponding to a second number of the plurality of reference clock signals that experience a rising edge during the down pulse.

4. The digital phase lock loop circuit of claim 1, wherein the numerically controlled oscillator comprises a phase accumulator register and wherein the first oscillator output signal comprises the most significant bit of the phase accumulator register and wherein the second oscillator output signal comprises a predetermined number of bits of the phase accumulator register.

5. The digital phase lock loop circuit of claim 4, wherein the numerically controlled oscillator further comprises:

an adder configured to receive a first digital number output by the phase accumulator register and the error signal and output a second digital number corresponding to a sum of the first digital number and the error signal; and wherein the phase accumulator register is configured to store the second digital number.

6. The digital phase lock loop circuit of claim 1, wherein the first phase accuracy extender further comprises:

a pipeline controller configured to receive the first oscillator output and the plurality of reference clock signals, the pipeline controller generating a plurality of phase-delayed signals corresponding to the first oscillator output signal at a plurality of delays corresponding to the plurality of reference clock signals;

an edge delay calculator configured to receive the first oscillator output signal and the second oscillator output signal, the edge delay calculator analyzing the second oscillator output upon an edge of the first oscillator output signal to determine the first delay amount and generating a phase select signal based on the first delay amount; and an edge delay multiplexer configured to receive the phase select signal and the plurality of phase-delayed signals, the edge delay multiplexer generating a phase-selected output signal comprising one of the phase-delayed signals specified by the phase select signal.

7. The digital phase lock loop circuit of claim 6, wherein the first phase accuracy extender further comprises:

an output deglitcher configured to receive the phase-selected output signal, the output deglitcher removing pulses briefer than a predetermined duration from the phase-selected output signal to generate the phase-enhanced output signal.

8. The digital phase lock loop circuit of claim 6, wherein the edge delay calculator analyzes the second oscillator output signal upon a rising edge of the first oscillator output signal and upon a falling edge of the first oscillator output signal.

9. The digital phase lock loop circuit of claim 1, further comprising:

a phase adder configured to receive the first oscillator output signal, the second oscillator output signal, and a phase offset select signal, the phase offset signal specifying a phase offset and the phase adder generating a first offset output signal by adding the phase offset to the first oscillator output signal and a second offset output signal by adding the phase offset to the second oscillator output signal; and a second phase accuracy extender configured to receive the first offset output signal, the second offset output signal, and the plurality of reference clock signals, the second phase accuracy extender determining a second delay amount from the second offset output signal and delaying the first offset output signal by the second delay amount to generate a second phase-enhanced output signal with edges aligned with at least one of the plurality of reference clock signals.

10. The digital phase lock loop circuit of claim 1, further comprising an analog phase lock loop that generates the plurality of reference clocks signals based on a master clock signal, wherein frequencies of the plurality of reference clock signals are integer multiples of a frequency of the master clock signal.

11. In a digital phase lock loop circuit, a method comprising:

determining a phase difference between a feedback signal derived from an output signal of the digital phase lock loop circuit and a reference frequency signal to generate an error signal indicative of the phase difference;

generating a first oscillator output signal with a frequency proportional to the error signal and a second oscillator output signal indicative of jitter of the first oscillator output signal in reference to the reference frequency signal;

determining a first delay amount from the second oscillator output signal; and delaying the first oscillator output signal by a first delay amount indicated by the second oscillator output signal to generate a phase-enhanced output signal with edges aligned with one of a plurality of reference clock signals.

12. The method of claim 11, wherein determining a phase difference between a feedback signal and a reference frequency signal comprises:

generating an up pulse with a first duration proportional to a phase lead of the reference frequency signal relative to the feedback signal;

generating a down pulse with a second duration proportional to a phase lag of the reference frequency signal relative to the feedback signal; and generating the error signal corresponding to the first duration or the second duration in terms of cycles of said one of the plurality of reference clock signals.

13. The method of claim 12, wherein generating the error signal corresponding to the first duration or the second duration comprises:

determining a first digital count, the first digital count corresponding to a first number of the plurality of reference clock signals that experience a rising edge during the up pulse; and determining a second digital count, the second digital count corresponding to a second number of the plurality of reference clock signals that experience a rising edge during the down pulse.

14. The method of claim 11, wherein the first oscillator output signal comprises the most significant bit of a phase accumulator register and wherein the second oscillator output signal comprises a predetermined number of bits of the phase accumulator register.

15. The method of claim 14, further comprising:

adding a first digital number output by the phase accumulator register and the error signal; and storing the second digital number within the phase accumulator register.

16. The method of claim 11, further comprising:

generating a plurality of phase-delayed signals corresponding to the first oscillator output signal at a plurality of delays corresponding to the plurality of reference clock signals;

analyzing the second oscillator output signal upon an edge of the first oscillator output signal to determine the delay amount;

generating a phase select signal based on the delay amount; and generating a phase-selected output signal comprising one of the phase-delayed signals specified by the phase-select signal.

17. The method of claim 16, further comprising:

removing pulses briefer than a predetermined duration from the phase-selected output signal to generate the phase-enhanced output signal.

18. The method of claim 16, wherein analyzing the second oscillator output signal upon an edge of the first oscillator output signal further comprises:

analyzing the second oscillator output signal upon a rising edge of the first oscillator output signal; and analyzing the second oscillator output signal upon a falling edge of the first oscillator output signal.

19. The method of claim 11, further comprising:

generating a first offset output signal by adding a phase offset to the first oscillator output signal based on an offset select signal;

generating a second offset output signal by adding the phase offset to the second oscillator output signal based on the offset select signal;

determining a second delay amount from the second offset output signal; and delaying the first offset output signal by the second delay amount to generate a second phase-enhanced output signal with edges aligned with at least one of the plurality of reference clock signals.

20. The method of claim 11, wherein the plurality of reference clock signals are generated from a master clock signal, wherein frequencies of the plurality of reference clock signals are integer multiples of a frequency of the master clock signal.

* * * * *